(12) United States Patent
Faurie et al.

(10) Patent No.: US 9,130,120 B2
(45) Date of Patent: Sep. 8, 2015

(54) GROUP III-V SUBSTRATE MATERIAL WITH THIN BUFFER LAYER AND METHODS OF MAKING

(71) Applicant: Saint-Gobain Cristaux Et Detecteurs, Courbevoie (FR)

(72) Inventors: Jean-Pierre Faurie, Valbonne (FR); Bernard Beaumont, Le Tignet (FR)

(73) Assignee: Saint-Gobain Cristaux Et Detecteurs, Courbevoie (FR)

( * ) Notice: Subject to any disclaimer, the term of this patent is extended or adjusted under 35 U.S.C. 154(b) by 0 days.

(21) Appl. No.: 14/142,266

(22) Filed: Dec. 27, 2013

(65) Prior Publication Data

US 2014/0185639 A1 Jul. 3, 2014

Related U.S. Application Data

(60) Provisional application No. 61/747,693, filed on Dec. 31, 2012.

(51) Int. Cl.
| | |
|---|---|
| *H01L 33/32* | (2010.01) |
| *H01S 5/30* | (2006.01) |
| *H01L 21/02* | (2006.01) |
| *H01L 33/12* | (2010.01) |
| *C30B 25/18* | (2006.01) |
| *C30B 29/40* | (2006.01) |
| *H01L 33/00* | (2010.01) |

(52) U.S. Cl.
CPC ............ *H01L 33/32* (2013.01); *C30B 25/18* (2013.01); *C30B 25/183* (2013.01); *C30B 29/40* (2013.01); *C30B 29/403* (2013.01); *C30B 29/406* (2013.01); *H01L 21/0243* (2013.01); *H01L 21/0254* (2013.01); *H01L 21/02389* (2013.01); *H01L 21/02433* (2013.01); *H01L 21/02458* (2013.01); *H01L 21/02494* (2013.01); *H01L 21/02609* (2013.01); *H01L 33/12* (2013.01); *H01S 5/3013* (2013.01); *H01L 33/0075* (2013.01); *Y10T 428/26* (2015.01)

(58) Field of Classification Search
CPC ............................ H01L 33/32; H01L 33/0075
USPC ........................................................... 257/94
See application file for complete search history.

(56) References Cited

U.S. PATENT DOCUMENTS

| | | | |
|---|---|---|---|
| 5,700,179 | A | 12/1997 | Hasegawa et al. |
| 5,800,725 | A | 9/1998 | Kato et al. |
| 5,942,445 | A | 8/1999 | Kato et al. |
| 6,413,627 | B1 | 7/2002 | Motoki et al. |

(Continued)

OTHER PUBLICATIONS

International Search Report for PCT/US2012/057931 dated Mar. 26, 2013, 4 pgs.

(Continued)

*Primary Examiner* — Roy Potter
*Assistant Examiner* — Paul Patton
(74) *Attorney, Agent, or Firm* — Abel Law Group, LLP; Robert N. Young

(57) ABSTRACT

A substrate comprises a Group III-V material having an upper surface and a buffer layer having a thickness of not greater than about 1.3 μm and overlying the upper surface of the substrate. A plurality of optoelectronic devices formed on the substrate having a normalized light emission wavelength standard deviation of not greater than about 0.0641 nm/cm² at a wavelength within a range of between about 400 nm to about 550 nm.

20 Claims, 3 Drawing Sheets

(56) References Cited

U.S. PATENT DOCUMENTS

| | | |
|---|---|---|
| 6,442,975 B1 | 9/2002 | Murakami et al. |
| 6,447,604 B1 | 9/2002 | Flynn et al. |
| 6,489,636 B1 | 12/2002 | Goetz et al. |
| 6,583,050 B2 | 6/2003 | Wenski et al. |
| 6,902,616 B1 | 6/2005 | Yamazaki et al. |
| 7,057,204 B2 | 6/2006 | Shibata |
| 7,253,499 B2 | 8/2007 | Shibata |
| 7,405,430 B2 | 7/2008 | Saxler et al. |
| 7,411,273 B2 | 8/2008 | Matsumoto |
| 7,723,709 B2 | 5/2010 | Zama et al. |
| 7,828,628 B2 | 11/2010 | Aoki et al. |
| 7,915,152 B2 | 3/2011 | Vaudo et al. |
| 8,158,497 B2 | 4/2012 | Hirai et al. |
| 2006/0043419 A1 | 3/2006 | Tachibana et al. |
| 2008/0224268 A1 | 9/2008 | Abe et al. |
| 2008/0308906 A1 | 12/2008 | Osada et al. |
| 2009/0135873 A1 | 5/2009 | Matsushita et al. |
| 2010/0220761 A1 | 9/2010 | Enya et al. |
| 2011/0006397 A1* | 1/2011 | Fujikura et al. ............... 257/615 |
| 2011/0092052 A1 | 4/2011 | Ueno |
| 2011/0237054 A1 | 9/2011 | Iso et al. |
| 2012/0161287 A1 | 6/2012 | Iza et al. |
| 2012/0175739 A1 | 7/2012 | Hirai et al. |
| 2012/0289125 A1 | 11/2012 | Billig et al. |
| 2013/0075770 A1* | 3/2013 | Chakraborty et al. ......... 257/94 |

OTHER PUBLICATIONS

U.S. Appl. No. 13/630,858, filed Sep. 28, 2012, Inventors: Jean-Pierre Faurie, et al.

* cited by examiner

GROUP III-V SUBSTRATE MATERIAL WITH THIN BUFFER LAYER AND METHODS OF MAKING

CROSS-REFERENCE TO RELATED APPLICATION

This application claims priority under 35 U.S.C. §119(e) to U.S. Patent Application No. 61/747,693 entitled "Group III-V Substrate Material with Thin Buffer Layer and Methods of Making," by Faurie et al., filed Dec. 31, 2012, which is assigned to the current assignee hereof and incorporated herein by reference in its entirety.

BACKGROUND

1. Field of the Disclosure

The following is directed to a semiconductive substrate which can be used in fabrication of electronic devices and a method of forming a semiconductive substrate, and particularly, methods of shaping substrates and improve devices formed from such substrates.

2. Description of the Related Art

Semiconductive-based compounds, including Group III-V materials, such as gallium nitride (GaN), ternary compounds, such as, indium gallium nitride (InGaN) and gallium aluminum nitride (GaAlN), and even the quaternary compounds (AlGaInN) are direct band gap semiconductors. Such materials have been recognized as having great potential for short wavelength emission, and thus suitable for use in the manufacturing of light emitting diodes (LEDs), laser diodes (LDs), UV detectors, and high-temperature electronics devices.

However, the development of such semiconductive materials has been hampered by difficulties surrounding the processing of such materials, particularly the formation of high-quality single crystalline forms of the material, which are required for manufacturing of short wavelength emission in optoelectronics. GaN is not found as a naturally occurring compound, and thus cannot be melted and pulled from a boule like silicon, gallium arsenide, or sapphire, because at usual pressures its theoretical melting temperature exceeds its dissociation temperature. As an alternative, the industry has turned to formation of bulk GaN crystals using epitaxial growth processes. However, problems still remain with the epitaxial approach, including the formation of suitable low defect density bulk GaN material and the existence of other crystalline morphological differences, including crystalline bow.

The existence of extended defects (threading dislocations, stacking faults, and antiphase boundaries) leads to significantly deteriorated performances and results in a shortened operating lifetime of devices. More specifically, the dislocations behave as non-radiative centers, thus reducing the light-emitting efficiency of light-emitting diodes and laser diodes made from these materials. Furthermore, other factors, such as the crystalline orientation can negatively impact the performance of devices formed on the GaN material.

BRIEF DESCRIPTION OF THE DISCLOSURE

According to one aspect, the present disclosure describes a substrate comprising a Group III-V material and having an upper surface, the substrate comprising an offcut angle ($\alpha$) defined between the upper surface and a crystallographic reference plane, the substrate further comprising an offcut angle variation ($2\beta$) of no greater than 1 degrees.

According to another aspect, the present disclosure describes a substrate comprising: a body comprising a Group III-V material and having an upper surface; and a buffer layer comprising a Group III-V material adjacent the upper surface of the body, wherein the buffer layer has an average thickness of not greater than 1.3 µm.

According to yet another aspect, the present disclosure describes a substrate comprising: a body comprising a Group III-V material and having an upper surface, the body comprising an offcut angle ($\alpha$) defined between the upper surface and a crystallographic reference plane, the body further comprising an offcut angle variation ($2\beta$); and a buffer layer comprising a Group III-V material adjacent the upper surface of the body, wherein the buffer layer has an average thickness of no greater than about 1.3 µm.

According to yet another aspect, the present disclosure describes a substrate comprising: a body comprising a Group III-V material and having an upper surface, the body comprising an offcut angle ($\alpha$) defined between the upper surface and a crystallographic reference plane, the body further comprising an offcut angle variation ($2\beta$) and a buffer layer comprising a Group III-V material adjacent the upper surface of the body, wherein the buffer layer has an upper surface, the buffer layer and body comprising an offcut angle ($\alpha$) defined between the upper surface of the buffer layer and a crystallographic reference plane, the buffer layer and body further comprising an offcut angle variation ($2\beta$) which is less than the offcut angle variation ($2\beta$) of the body.

According to yet another aspect, the present disclosure describes a production lot of substrates comprising at least 20 substrates, each of the substrates in the lot comprising a Group III-V material and having an upper surface, the body comprising an offcut angle ($\alpha$) defined between the upper surface and a crystallographic reference plane, the substrate further comprising an offcut angle variation ($2\beta$) of not greater than about 1 degrees.

According to yet another aspect, the present disclosure describes a production lot of substrates comprising at least 20 substrates, each of the substrates in the lot comprising a Group III-V material and having an upper surface, the body comprising an offcut angle ($\alpha$) defined between the upper surface and a crystallographic reference plane, the substrate further comprising an offcut angle variation ($2\beta$) of not greater than about 1 degrees.

According to yet another aspect, the present disclosure describes a substrate comprising a body comprising a Group III-V material and having an upper surface; and a buffer layer comprising a Group III-V material overlying the upper surface of the body having an average thickness of not greater than about 1.3 µm, wherein the substrate is configured to provide a surface for the formation of a plurality of optoelectronic devices overlying the buffer layer and having a normalized light emission wavelength standard deviation (n$\sigma$) of no greater than about 0.0641 nm/cm$^2$ at a wavelength within a range of between about 400 nm to about 550 nm.

According to yet another aspect, the present disclosure describes a substrate structure comprising: a substrate comprising a Group III-V material having an upper surface; and a plurality of optoelectronic devices overlying the upper surface of the substrate, wherein the plurality of optoelectronic devices overlying the upper surface of the substrate having a normalized light emission wavelength standard deviation (n$\sigma$) of not greater than about 0.0641 nm/cm$^2$ at a wavelength within a range of between about 400 nm to about 550 nm.

According to yet another aspect, the present disclosure describes a production lot of substrate structures comprising at least about 20 substrate structures, wherein each substrate structure includes a substrate and a plurality of optoelectronic devices disposed on the substrate having a normalized lot light emission wavelength standard deviation of not greater than about 0.0641 nm/cm$^2$ at a wavelength of about 400 nm to about 550 nm.

According to yet another aspect, the present disclosure describes an optoelectronic structure comprising a plurality of optoelectronic devices formed on a substrate comprising Group III-V material and having an upper surface, the substrate comprising an offcut angle ($\alpha$) defined between the upper surface and a crystallographic reference plane, the substrate further comprising an offcut angle variation (2$\beta$), wherein the plurality of optoelectronic structures has an average light wavelength standard deviation of not greater than 1.3 nm.

According to yet another aspect, the present disclosure describes a method of forming a substrate comprising: providing a body comprising a Group III-V material; and forming a buffer layer comprising a Group III-V material on the upper surface of the body, the buffer layer having an upper surface and a thickness of not greater than 1.3 μm.

According to yet another aspect, the present disclosure describes a method of forming a substrate comprising: providing a body comprising a Group III-V material, the body having an upper surface and a rear surface opposite the upper surface, wherein the upper surface of the body has an arrangement of terraces and step risers; performing at least one finishing operation on the upper surface of the body; and forming a buffer layer comprising a Group III-V material on the upper surface of the body, the buffer layer having an upper surface and a rear surface adjacent the body, wherein the upper surface of the buffer layer has a more uniform arrangement of the terraces and step risers than the upper surface of the body.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

The following is generally directed to substrate materials, and particular, substrates made of a semiconductor material, which can be used in fabrication of electronic devices. More particularly, substrates of the embodiments herein may be used in the formation of light emitting diodes (LEDs) or laser diodes (LDs). The substrates of the embodiment can include a Group III-V material including for example gallium nitride (GaN). It will be appreciated that reference to Group III-V materials, include compounds having at least one element from Group III of the Periodic Table of Elements and at least one element from Group V of the Periodic Table of Elements.

Figure 1:
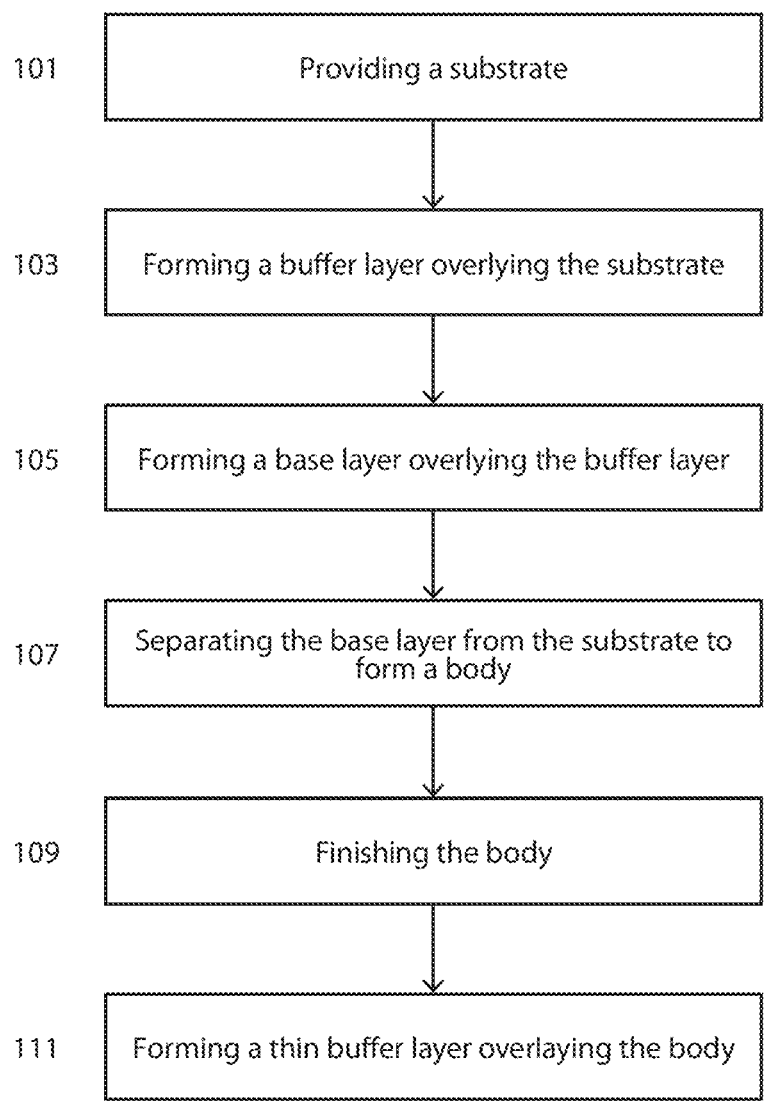
FIG. 1 includes a flowchart providing a method of forming a semiconductive substrate material for use in forming an electronic device in accordance with embodiment.

FIG. 1 includes a flow chart illustrating a method for forming a semiconductor substrate comprising a semiconductor material suitable for fabrication of electronic devices thereon in accordance with the embodiment. As illustrated, the process can be initiated at step 101 by providing a substrate, also referred to as a template substrate. The template substrate can be a structure suitable for supporting a plurality of layers formed thereon, and function as a heteroepitaxial support structure for the formation of a plurality of layers thereon.

In accordance with one embodiment, the template substrate can be an inorganic material. Some suitable inorganic materials can include oxides, carbides, nitrides, borides, oxycarbides, oxyborides, oxynitrides, and a combination thereof. In certain instances the template substrate can include alumina, and more particularly, may include single crystal alumina (i.e., sapphire). One embodiment utilizes a substrate consisting essentially of sapphire.

Figure 2A:
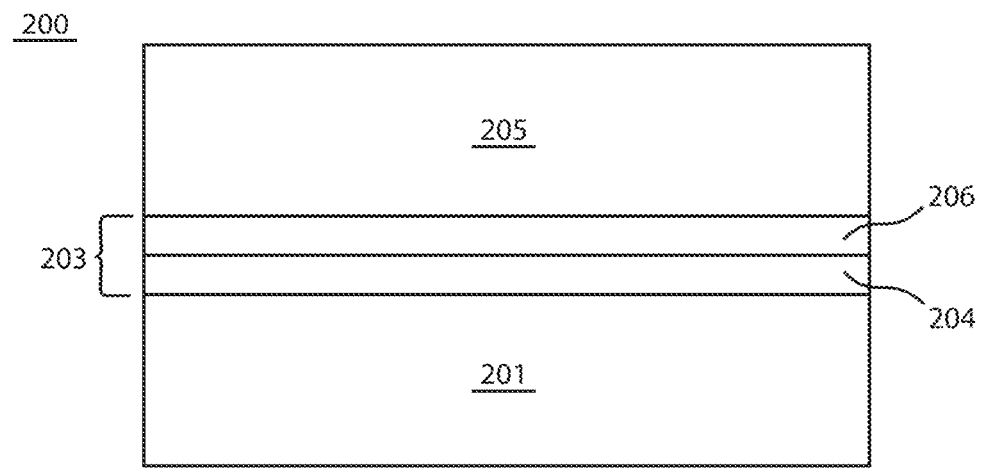
FIG. 2A includes a cross-sectional illustration of the layers formed during formation of a semiconductive substrate in accordance with an embodiment.

The process can continue at step 103 by forming a buffer layer overlying the substrate. Turning briefly to FIG. 2A, a semiconductor substrate 200 is illustrated in accordance with embodiment. Notably, the semiconductor substrate 200 can include a substrate 201 (i.e., template substrate) and a buffer layer 203 overlying the substrate 201. In particular, the buffer layer 203 can overlie an upper major surface of the substrate 201, and more particularly, the buffer layer 203 can be in direct contact with the upper major surface of the substrate 201.

Forming the buffer layer 203 can include a deposition process. For example, the substrate can be loaded into a reaction chamber, and after providing a suitable environment within the reaction chamber, a buffer layer can be deposited on the substrate. According to one embodiment, a suitable deposition technique can include chemical vapor deposition. In one particular instance, the deposition process can include metal-organic chemical vapor deposition (MOCVD).

The buffer layer 203 may be formed from a plurality of films. For example, as illustrated in FIG. 2A, the buffer layer 203 can include a film 204 and a film 206. In accordance with an embodiment, at least one of the films, can include a crystalline material. In more particular instances, the film 204, which can be in direct contact with the surface of the substrate 201, can include silicon, and may consist essentially of silicon. The film 204 may facilitate separation between the substrate 201 and semiconductor layers overlying the film 204 as described herein.

As illustrated in FIG. 2A, the film 206 can overlay, and more particularly, can be in direct contact with the film 204. The film 206 can have suitable crystallographic features for epitaxial formation of subsequent layers formed thereon. Notably, in one embodiment, the film 204 can include a semiconductor material. Suitable semiconductor materials can include a Group III-V compound material. In one particular instance, the film 206 can include a nitride material. In another example, the film 206 can include gallium, aluminum, indium, and a combination thereof. Still, in one particular embodiment, the film 206 can comprise aluminum nitride, and more particularly, the film 206 can consist essentially of aluminum nitride.

In an exemplary structure, the buffer layer 203 can be formed such that the film 204 includes silicon and is directly contacting a major surface of the substrate 201. Furthermore, the film 206 can directly contact a surface of the film 204 and include a Group III-V material.

After forming a buffer layer at step 103, the process can continue at step 105 by forming a base layer overlying the buffer layer 203. Referring briefly to FIG. 2A, the semiconductor substrate 200 can include a base layer 205 overlying the buffer layer 203. In particular, the base layer 205 can be formed such it is overlying a surface of the buffer layer 203, and more particularly, the base layer can be in direct contact with the film 206 of the buffer layer 203.

It will also be appreciated that the formation of semiconductor substrates according to embodiments herein may be achieved without necessarily creating a mask or modifying the surface of the substrate via grooving or roughening, or utilization of etching techniques.

According to an embodiment, upon suitably forming a buffer layer 203, the substrate 201 and buffer layer 203 may be placed within a reaction chamber to conduct an epitaxial growth process. The base layer 205 can be formed through an epitaxial growth process, such as hydride vapor phase epitaxy (HYPE). In one particular instance, the base layer 205 can be made of a Group III-V material. Some suitable Group III-V materials can include nitride materials. Furthermore, the base layer 205 may include gallium. In particular instances, the base layer 205 may include gallium nitride (GaN), and more particularly, may consist essentially of gallium nitride.

Particular methods of forming the base layer 205 can be undertaken. For example, the epitaxial growth of the base layer 205 can be conducted in various growth modes, wherein a lower region 208 of the base layer 205 can be grown in a first mode, and an upper region 210 of the base layer 205 can be grown in a second mode different than the first mode. For example, in one embodiment the base layer 205 can be initially formed as an epitaxial layer grown in a 3-dimensional (3D) growth mode, such that the lower region 208 of the base layer 205 may be formed in the 3D growth mode. A 3D growth mode can include the simultaneous growth of the base layer 205 material along multiple crystallographic directions. A 3D growth process can include spontaneous formation of island features on the buffer layer 203. The spontaneously formed island features can be randomly positioned on the buffer layer 203, defining various mesas having multiple facets and valleys between the mesas.

Alternatively, or additionally, the base layer 205 can be formed using a 2 dimensional (2D) epitaxial growth mode. A 2D growth mode is characterized by preferential growth of the material in one crystallographic plane and limited growth of the crystalline material along other crystallographic directions. For example, in one embodiment, formation of a base layer 205 comprising GaN in a 2D growth mode includes preferential growth of the GaN in the c-plane (0001).

As indicated above, the base layer 205 can be formed using a combination of 3D and 2D growth modes. For example, the lower region 208 of the base layer 205 may be initially formed in a 3D growth mode, wherein island features are spontaneously formed and randomly arranged on the buffer layer 203 as a non-continuous layer of material. However if the 3D mode growth is pursued the layer becomes continuous, exhibiting a faceted aspect and a substantially non-uniform thickness. Following the 3D growth mode, growth parameters can be altered to change to a 2D growth mode, wherein lateral growth is favored and thickness uniformity improved. In this manner, the upper region 210 of the base layer 205 can be formed through a 2D growth mode. Combining 3D and 2D growth modes can facilitate reduction of the dislocation density of the base layer 205 and altering (e.g., increasing) the internal strain on the base layer 205.

It will be appreciated that formation of the base layer 205 can include multiple changes in growth modes. For example, in one embodiment, the base layer can be formed by an initial 3D growth mode, followed by a 2D growth mode, and further growth in a 3D growth mode.

Switching between growth modes may be completed by modification of certain growth parameters including growth temperature, growth rate, pressure of vapor phase reactant and non-reactant materials, ratio of reactant and non-reactant materials in the reaction atmosphere, growth chamber pressure, and a combination thereof. Reference herein to a reactant material includes reactant materials such as nitrogen-containing materials, such as ammonia. Other reactant materials can include halide phase components, including for example, metal halide components such as gallium chloride. Non-reactant materials can include certain types of gases, including for example, noble gases, inert gases, and the like. In particular instances the non-reactant material can include gases such as nitrogen and or hydrogen.

For certain processes, the growth temperature may be changed to facilitate a change between 3D and 2D growth modes. In one embodiment, change of the growth temperature can include an increase in the growth temperature to change from a 3D to a 2D growth mode. For example, in changing from a 3D to a 2D growth mode, the temperature may be changed by at least about 5° C., such as at least about 10° C., at least about 15° C., at least about 20° C., at least about 30° C., at least about 35° C., or even at least about 40° C. In still other embodiments, in changing from a 3D to a 2D growth mode, the growth temperature can be changed by not greater than about 100° C., such as not greater than about 90° C., not greater than about 80° C., not greater than about 70° C., or even not greater than about 60° C. It will be appreciated that the change in growth temperature can be within a range between any of the minimum and maximum values noted above.

In accordance with certain embodiments, the process of forming the base layer 205 can be conducted at a growth rate of at least 50 microns per hour (microns/hr). In other embodiments, the rate of forming the base layer 205 can be greater, such as at least about 75 micron per hours, at least about 100 microns per hour, at least about 150 microns per hour, at least about 200 microns per hour, or even at least about 250 microns per hour. In another embodiment, the process of forming the base layer 205 can be conducted at a rate of not greater than about 1 mm per hour, such as not greater than 750 microns per hour not great 500 microns per hour, or even not greater than about 300 microns per hour. It will be appreciated the process of forming the base layer can be constructed at a rate within a range within any of the minimum maximum values noted above.

For certain processes, the growth rate may be changed to facilitate a change between 3D and 2D growth modes. For example, the growth rate can be decreased in changing from a 3D to a 2D growth mode. In particular, changing from 3D to 2D growth can include altering the growth rate by at least about 5 microns per hour (i.e., microns/hr). In still other embodiments, in changing from a 3D to a 2D growth mode, the growth rate can be changed by not greater than about 200 microns per hour. It will be appreciated that the change in growth rate can be within a range between any of the minimum and maximum values noted above. It will be appreciated that the change in growth rate can be a decrease in the growth rate when changing from a 3D to a 2D growth mode.

According to other embodiments, the process of changing from 3D to 2D growth modes may be induced by a change in growth rate by at least a factor of 2. For example, the growth rate can be decreased by a factor of at least 2 in changing from a 3D growth mode to a 2D growth mode. In other embodiments, the growth rate can be decreased by a factor of at least about 3, at least about 4, or even at least about 5. In particular instances, the decrease in the growth rate is not greater than about a factor of 8, not greater than a factor of about 7, or not greater than a factor of about 6.

It will be appreciated that in changing the growth mode, one or more of the above-identified factors can be changed. For example, the growth temperature can be changed, while the growth rate is held steady. Alternatively, the growth rate can be changed while the growth temperature is maintained. And still, in another embodiment, both the growth rate and growth temperature may be changed to effectuate the change in growth modes.

After suitably forming the base layer 205, the average thickness of the base layer 205 can be sufficiently thick to support itself and provide a suitable substrate surface for the formation of electronic devices thereon after certain post-formation shaping processes. For example, the average thickness of the base layer 205 can be not greater than about 5 mm, such as not greater than about 4 mm, not greater than about 3 mm, not greater than about 2 mm, or even not greater than about 1.5 mm. Still, it will be appreciated that the base layer 205 can be formed such as that it has an average thickness of at least about 0.1 mm, such at least 0.2 mm, at least 0.5 mm, at least 0.8 mm, or even at least 1 mm. It will be appreciated that the base layer 205 can have an average thickness within a range of between any of the minimum and maximum values noted above, including for example, within a range between about 0.1 mm and about 5 mm.

The base layer 205 can be formed to have a particular dislocation density. The dislocation density of the base layer 205 can be measured at the upper surface of the base layer upon forming. A suitable method of measuring the dislocation density includes use of cathodoluminescence microscopy operated at room temperature and polychromatic light detection without monochromator under 10 keV e-beam, spot size 70, wherein the machine is an SEM JSM-5510, commercially available from JEOL Corporation. For a dislocation density measurement of approximately $10^8$ cm$^{-2}$, the magnification is 4000× and the area is typically 700 µm². For a dislocation density measurement of approximately $10^6$ cm$^{-2}$, the magnification is typically 500-1000× and the area is typically 0.1 mm².

According to one embodiment, the base layer 205 can have a dislocation density of not greater than about $1\times10^8$ dislocation/cm², as measured at an upper surface of the base layer 205. In other embodiments, the dislocation density of the base layer 205 can be less, such that it is not greater than about $1\times10^7$ dislocation/cm², not greater than about $6\times10^6$ dislocation/cm², or even not greater than about $1\times10^6$ dislocation/cm². Still, the base layer 205 may have a dislocation density that is at least about $1\times10^5$ dislocation/cm², such as at least $2\times10^5$ dislocation/cm², at least $3\times10^5$ dislocation/cm², or even at least $5\times10^5$ dislocation/cm². It will be appreciated that the base layer can have a dislocation density within a range within any of the minimum and maximum values noted above.

During the process of formation of the semiconductive layers, including for example, the base layer 205, the substrate 201 may be separated from the base layer 205. The separation can be facilitated by the dissociation of a portion of the buffer layer 203, and particularly, a film within the buffer layer 203. In accordance with an embodiment, the buffer layer 203 can include a film, such as silicon, wherein at elevated temperatures utilized during the continuous growth process, the film is thermally dissociated. Thermal dissociation facilitates separation between the substrate 201 and the plurality of semiconductive layers. Accordingly, upon completion of the growth process, the base layer 205 can be completely removed from the substrate 201.

Figure 2B:
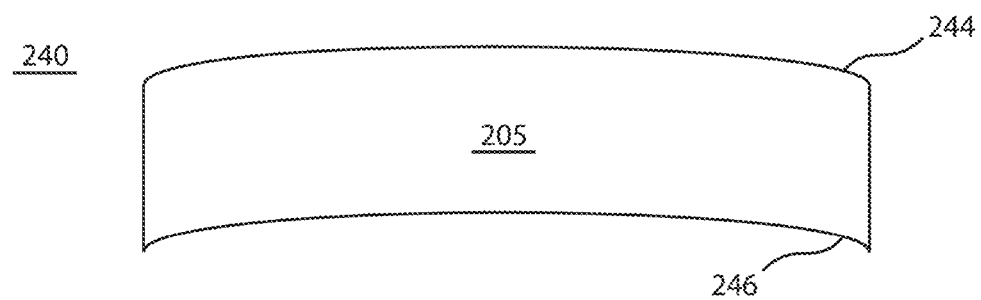
FIG. 2B includes a cross-sectional illustration of a free-standing substrate formed from the semiconductive substrate that includes a body having a concave curvature in accordance with an embodiment.
Figure 2C:
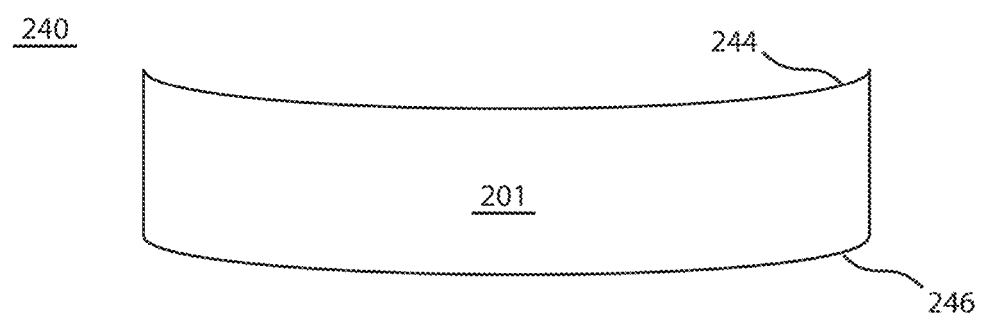
FIG. 2C includes a cross-sectional illustration of a free-standing substrate formed from the semiconductive substrate that includes a body having a convex curvature in accordance with an embodiment.

After separating the substrate 201 from the base layer 205, a free-standing substrate is formed of the material of the base layer 205. The free-standing substrate can have a body 240, which may have a curvature or bow. In particular instances, the body 240 can have an upper surface 244 representing a Ga-face and a rear surface 246 representing a N-face, and the body 240 can have a concave curvature, based upon the curvature of the rear surface 246, such as the body illustrated in FIG. 2B. In other instances, the body 240 can have an upper surface 244 representing a Ga-face and a rear surface 246 representing a N-face, and the body 240 can have a convex curvature, based upon the curvature of the rear surface 246, such as the body illustrated in FIG. 2C.

Referring again to FIG. 1, after forming the free-standing substrate, the body can undergo a finishing process at 109. Finishing can include suitable material removal processes, including for example, grinding, lapping, polishing and the like to form a free-standing substrate body having suitable geometric characteristics. Finishing can also include a shaping operation, such as disclosed for example in U.S. application Ser. No. 13/630,858, which is incorporated herein by reference. For example, the shaping process can be conducted before or after other finishing processes, and in particular embodiments, the shaping process is conducted before the other finishing processes. According to one particular embodiment, the finishing process can include a double-sided process, wherein the body is disposed between two finishing surfaces (e.g., lapping heads, grinding heads, polishing heads, etc.).

After finishing, at 111, a thin buffer layer can be formed adjacent the upper surface of the body of the free-standing substrate and more particularly, the thin buffer layer can be in direct contact with the upper major surface of the substrate.

Forming the thin buffer layer can include a deposition process. For example, the body can be loaded into a reaction chamber, and after providing a suitable environment within the reaction chamber, a buffer layer can be deposited on the substrate. According to one embodiment, a suitable deposition technique can include chemical vapor deposition. In one particular instance, the deposition process can include metal-organic chemical vapor deposition (MOCVD). In even more particular embodiments, the deposition process can include an MOCVD in a 2D growth mode, which can be achieved in the same manner as discussed above.

The thin buffer layer can have a thickness of no greater than about 1.3 µm, no greater than about 1.2 µm, no greater than about 1.1 µm, no greater than about 1 µm, no greater than about 0.9 µm, no greater than about 0.8 µm, no greater than about 0.7 µm, no greater than about 0.6 µm, no greater than about 0.5 µm, no greater than about 0.45 µm, no greater than about 0.4 µm, no greater than about 0.35 µm, no greater than about 0.3 µm, no greater than about 0.25 µm, no greater than about 0.2 µm, no greater than about 0.15 µm, no greater than about 0.1 µm. In further embodiments, the thin buffer layer can have a thickness of at least about 0.0001 µm, at least about 0.0005 µm, at least about 0.001 µm, at least about 0.005 µm, at least about 0.01 µm, at least about 0.02 nm, at least about 0.04 nm, at least about 0.05 µm, at least about 0.08 nm, at least about 0.1 µm, at least about 0.15 µm, at least about 0.2 µm, at least about 0.25 μm, or even at least about 0.3 μm. The thickness of the thin buffer layer can be within a range including any of the minimum and maximum values noted above.

According to an embodiment, the thickness of the thin buffer layer can be within a range of between at least about 0.01 μm to no greater than about 1.3 μm, within a range of between at least about 0.02 μm to no greater than 1.2 μm, within a range of between at least about 0.04 μm to no greater than about 1.1 μm, within a range of between at least about 0.08 μm to no greater than about 1.0 μm, or within a range of between at least about 0.1 μm to no greater than about 0.8 μm. In certain embodiments, the thickness of the thin buffer layer can be within a range of about 0.2 μm to no greater than about 0.5 μm. In a particular, yet non-limiting embodiment, the thickness of the thin buffer layer can be about 0.3 μm.

The buffer layer may be formed from a crystalline material. The buffer layer can have suitable crystallographic features for epitaxial formation of subsequent layers formed thereon. Notably, in one embodiment, the buffer layer can include a semiconductor material. Suitable semiconductor materials can include a Group III-V compound material. In one particular instance, the buffer layer can include a nitride material. In another example, the buffer layer can include gallium, aluminum, indium, and a combination thereof. Still, in one particular embodiment, the buffer layer can comprise gallium nitride (GaN), and more particularly, the buffer layer can consist essentially of gallium nitride.

Figure 3:
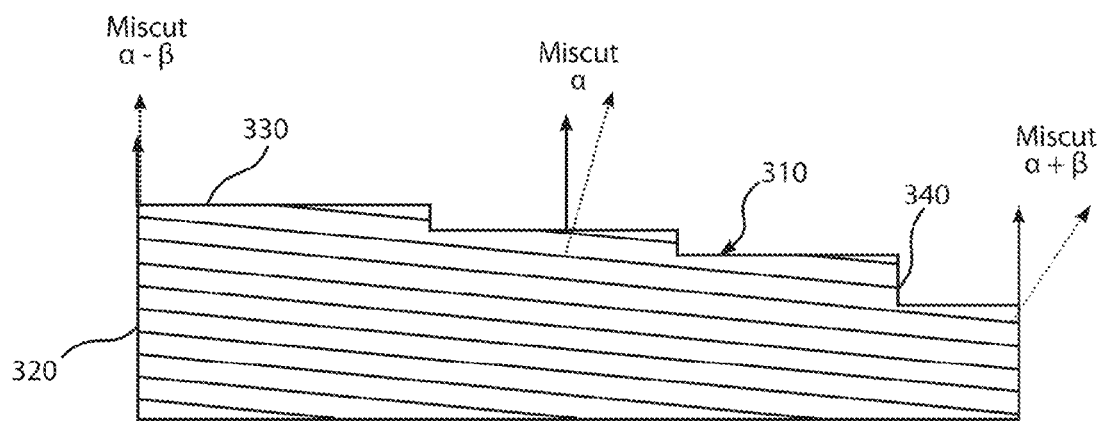
FIG. 3 includes a cross-sectional illustration of the upper surface of a body a finished free-standing substrate.

To better describe surface morphology of the upper surface of the body and the surface morphology of the upper surface of the buffer layer, reference is made to FIG. 3, which illustrates the upper surface 310 of a body 320 formed and finished as described herein. As the body 320 is crystalline in nature, the upper surface 310 of the body contains a plurality of terraces 330 and step risers 340. As illustrated, the plurality of terraces 330 and step risers 340 have a certain amount of variability or non-uniformity in their dimensions. For example, the terraces 330 can have a wide variability in their width. Likewise, there may be non-uniformity in the height of step risers.

Figure 4:
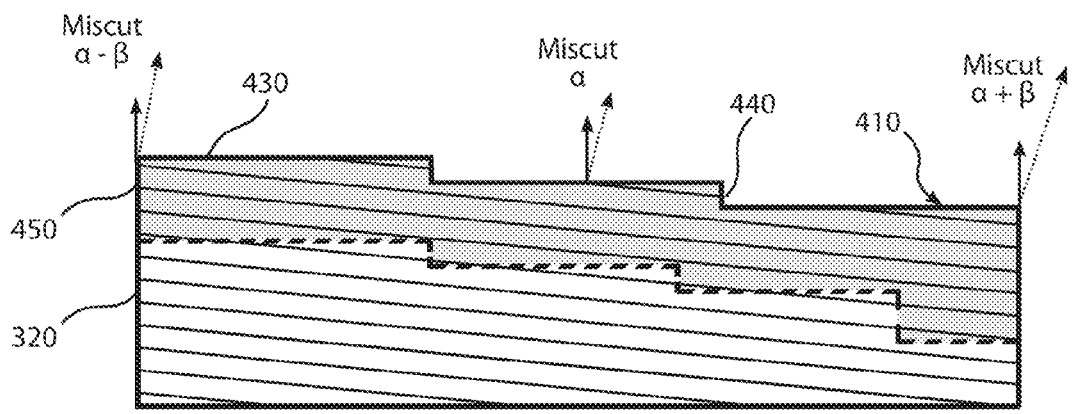
FIG. 4 includes a cross-sectional illustration of the upper surface of a finished free-standing substrate having a thin buffer layer.
Figure 5:
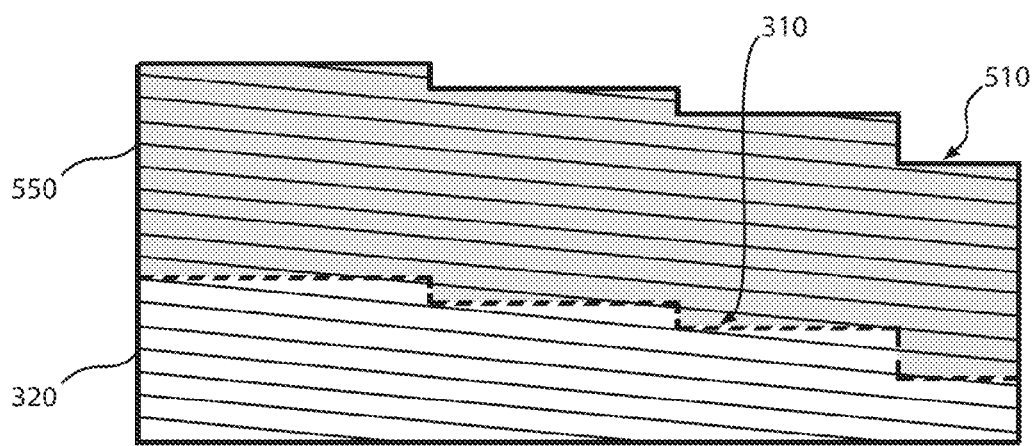
FIG. 5 includes a cross-section illustration of the upper surface of a finished free-standing substrate having a thick buffer layer.

FIG. 4 illustrates the body 320 depicted in FIG. 3 and a thin buffer layer 450 formed in direct contact with upper surface of the body 320. As illustrated, the terraces 430 and step risers 440 on the upper surface 430 of the buffer layer 450 are more uniform than the terraces 330 and step risers 340 on the upper surface 310 of the body 320. Without being limited by theory, it is believed that by forming a thin buffer layer 450 on the upper surface 310 of a finished body 320 as described herein, the surface morphology of the upper surface 410 of the buffer layer 450 differs from the surface morphology of the upper surface 310 of the body 320 such that the dimensions of the plurality of terraces and step risers become more uniform. After a certain thickness, it is believed that the upper surface of the buffer layer may have a surface morphology that is more consistent with the surface morphology of the upper surface of the body, such that there remains substantially the same amount of non-uniformity in the terraces and step risers as in the upper surface of the body. For example, FIG. 5 illustrates a buffer layer 550 with a much greater average thickness than the buffer layer 450. As illustrated, the surface morphology of the upper surface 510 of the buffer layer 550 in consistent with the surface morphology of the 310 upper surface of the body 320.

Referring again to FIG. 4, in particular embodiments, the variability between the dimensions of the terraces 330 and step risers 340 can decrease after the addition of the thin buffer layer by at least about 10%, at least about 20%, at least about 30%, at least about 40%, at least about 50%, at least about 60%, at least about 70%, or even at least about 80%.

In further particular embodiments, the average width of the terraces across the upper surface of the free standing substrate may increase after addition of the thin buffer layer 450. In certain embodiments, the average width of the terraces may increase by at least 10%, at least about 20%, at least about 30%, at least about 40%, at least about 50%, at least about 60%, at least about 70%, or even at least about 80%.

In even further particular embodiments, the number of terraces across the upper surface of the free standing substrate may decrease after addition of the thin buffer layer. In certain embodiments, the number of terraces may decrease by at least 10%, at least about 20%, at least about 30%, at least about 40%, at least about 50%, at least about 60%, at least about 70%, or even at least about 80%.

It is further believed that the surface morphology of the upper surface of body is rearranged by addition of the thin buffer such that particular crystalline properties (e.g., offcut angle variation) across the surfaces of the body have been modified. In particular, the free-standing substrate after addition of the thin buffer layer can have particular geometric and crystallographic features as described herein.

For example, in one embodiment, the free-standing substrate after addition of the thin buffer layer can have a particular offcut angle (α), measured, at the center of the free-standing substrate, as the angle between the upper surface and a crystallographic reference plane within the crystalline material. For ease of reference to certain parameters described herein, FIG. 3 includes a cross-sectional illustration of a conventional substrate body formed through conventional means, and FIG. 4 includes a cross-sectional illustration of a substrate body and thin buffer layer formed according to an embodiment herein. As illustrated, the conventional body of FIG. 3 demonstrates significant non-uniformity in the terraces and step riser arrangement. By contrast, and as illustrated in FIG. 4, the substrate having the thin buffer layer formed according to the embodiments herein demonstrates a more uniform arrangement of the terraces and step risers.

According to one embodiment, the free-standing substrate after addition of the thin buffer layer can have an offcut angle (α) of not greater than about 2 degrees, such as not greater than about 1.5 degrees, not greater than about 1 degree, not greater than about 0.8 degrees, or even not greater than about 0.6 degrees. Still, the offcut angle (α) can be at least about 0.01 degrees, such as at least about 0.05 degrees, at least about 0.1 degrees, at least about 0.2 degrees, at least about 0.3 degrees or even at least about 0.6 degrees. The offcut angle can be within a range including any of the minimum and maximum values noted above.

It will be appreciated that the offcut angle direction may also be controlled with particularity. For example, the offcut angle direction can be purposefully angled towards the m-plane [1-100] a-plane [11-20], a combination thereof, or any other direction. In accordance with another embodiment, the body can demonstrate a particular offcut angle variation (2β) that is measured via X-Ray diffractometry through using X'Pert Pro PANalytical equipment. Using the X'Pert Pro PANalytical equipment, the offcut angle (α) can be determined by X-ray diffraction using a center point and 4 points separated by 90 degrees and spaced apart at a distance of 22 mm (95% of the dimension of the radius) from the center of the substrate body. The offcut angle variation (2β) along a diameter is calculated based upon the X-ray analysis using the software X'Pert Epitaxy v. 4.2. Generally, the calculations are based upon use of four ω-scans (sometimes also called rocking curves) are taken at intervals of $\phi=90°$. A graph with the $\omega$ values on Y ordinate and the $\phi$ values on X abscissa is displayed. The four values of $\omega_o$ (the four maxima peaks corresponding to the four $\omega$-scans) are plotted according to their $\phi$ values (for ex. 0°, 90°, 180°, 270°). Then the graph including at least these 4 points is fitted with a sinusoidal function. The function has the equation: $\omega=A+\alpha^*\cos(Pi^*(\phi-C)/180)$ wherein "A" is a constant (average value of the different measured $\omega_o$), "$\alpha$" is the off-cut value (in degrees), "C" is a $\phi$ angle precising the relative direction of the off-cut angle. It will be appreciated that during $\omega$-scan analysis, the detector remains stationary and the sample is rotated about the $\omega$ axis.

In particular embodiments, the free-standing substrate after addition of the thin buffer layer can have an offcut angle variation (2β) of not greater than about 1 degree, no greater than about 0.95 degree, no greater than about 0.9 degree, no greater than about 0.85 degree, no greater than about 0.8 degree, no greater than about 0.75 degree, no greater than about 0.7 degree, no greater than about 0.6 degree, no greater than about 0.4 degree, no greater than about 0.2 degrees, not greater than about 0.16 degrees, not greater than about 0.14 degrees, or even not greater than about 0.1 degrees, not greater than about 0.08 degrees, or even not greater than about 0.06 degrees. Still, the offcut angle variation across the wafer can be at least about 0.005 degrees or at least about 0.008 degrees. The offcut angle variation can be within a range including any of the minimum and maximum values noted above. In a further particular embodiment, the offcut angle variation (2β) of the free standing substrate does not change after the addition of the thin buffer layer.

The body of the free standing substrate can include a Group III-V material, particularly a nitride containing material, and more particularly a gallium containing material. In certain instances, the body can be a free-standing gallium nitride substrate, which can consist essentially of gallium nitride, not including dopant materials.

The body can be formed such that it has an average thickness between the upper surface and the rear surface of at least about 10 microns. In other instances, the average thickness of the body may be greater, such as at least about 20 microns, at least about 30 microns, at least about 40 microns, or even at least about 50 microns. Still, the average thickness of the body may be not greater than about 3 mm, such as not greater about 2 mm, not greater than about 1 mm, not greater than about 800 microns, or even not greater than about 500 microns not greater than about 300 microns, not greater than about 200 microns, or even not greater than about 100 microns. It will be appreciated that the body can have an average thickness within a range between any of the minimum and maximum values noted above.

According to one embodiment, the crystallographic reference plane can be the a-plane, m-plane, or c-plane. More particularly, the crystallographic reference plane can be a c-plane that is tilted toward the a-plane or m-plane. It will be appreciated that the crystallographic reference plane can include various particular planes, including for example, but not limited to, the c and –c polar planes (0002) and (000-2), non-polar planes such as the m-plane family {1-100}, the a-plane family {11-20}, or semi polar planes such as {11-22}, {10-12}, {30-31}, {20-21} or {30-3-1}.

Certain free-standing bodies according to the present embodiments can have a particular physical bow. The bow can be measured as the maximum deviation of the surface from a plane defined as the best least squared fit to the surface of the substrate. That is, for example, the curvature of the body can be notably low, demonstrating substantially little to no bowing. According to one embodiment, the body can have a bow corresponding to a radius of curvature of at least about 1.5 m. In other cases, the bow of the body can correspond to a radius of curvature of at least about 1.8 m, at least about 2 m, at least about 2.5 m, at least about 3 m, at least about 5 m, at least about 10 m, at least about 50 m, at least about 100 m, or even at least about 200 m.

According to an embodiment, the bow is measured according to the equation: $zC-0.25\times(zS+zN+zE+zW)$, where zC is the height of a point located in the center of the body (or body and buffer layer together), and the notations zS, zN, zE and zW represent the height of the four points located at 24 mm from the center point of a 2-inch body and regularly spaced by 90° around the center point. The height is measured along an axis z essentially perpendicular to the surface of the body in its center. The bow value (h) can be very small compared to the substrate diameter (d). The perpendicular direction can be normal to a reference plane of the measurement tool on which the substrate is laying. For substrates of various diameters, the four points away from the center used to measure the bow can be located at a distance of at least about 90%, and preferably at a distance equal to 95% of the dimension of the radius from the center of the body. For example, the 4 points on the ring will be located at 48 mm on a substrate body having a diameter of 4 inches. The relation between the bow (h) the diameter of the substrate body (d), and the physical radius of curvature (p) can be defined by $\rho=d^2/8h$.

Moreover, the body formed according to the processes of embodiments herein can have a particular total thickness variation (TTV). For example, the TTV can be not greater than about 50 μm, such as not greater than about 20 μm, not greater than about 10 μm, not greater than about 5 μm, or even not greater than about 2 μm. TTV can be measured via standard metrology tool from SygmaTech. Still, in certain instances, the TTV can be at least about 5 μm, such as at least about 10 μm, or at least about 15 μm. It will be appreciated that the body can have a TTV within a range between any of the minimum and maximum values noted above.

Generally, the free standing substrate can have a disc-like shape defining a particular diameter. For example, the diameter of the body can be at least about 2 inches (approximately 5.1 cm), at least about 3 inches (approximately 7.6 cm), at least about 10 cm (approximately 4 inches), at least about 15 cm (approximately 6 inches), at least about 20 cm (approximately 8 inches) or even at least about 30.5 cm (approximately 12 inches). In other embodiments, no greater than about 12 inches (approximately 30.5 cm), no greater than about 11 inches (approximately 27.9 cm), no greater than about 10 inches (approximately 25.4 cm), or no greater than about 9 inches (approximately 22.9 cm). It will be appreciated that the diameter of the substrate can be within a range of between any minimal and maximum values noted above. For example, the diameter of the substrate can be within a range of between at least about 2 inches (approximately 5.1 cm) to no greater than about 12 inches (approximately 30.5 cm), within a range of between at least about 3 inches (approximately 7.6 cm) to no greater than about 11 inches (approximately 27.9 cm), within a range of between at least about 4 inches (approximately 10 cm) to no greater than about 10 inches (approximately 25.4 cm), or within a range of between at least about 5 inches (12.7 cm) to no greater than 9 inches (approximately 22.9 cm).

In some embodiments, the free standing substrate can have a surface area of the upper surface of the substrate. In certain embodiments, the surface area can be at least about 20.2 $cm^2$, at least about 45.4 $cm^2$, at least about 78.5 $cm^2$, at least about 176.6 $cm^2$, at least about 314.2 $cm^2$, or at least about 730.6 cm². In further embodiments, the surface area can be no greater than about 730.6 cm², no greater than about 615.8 cm², no greater than about 506.7 cm², no greater than about 415.5 cm². It will be appreciated that the surface area can be within a range of between any of the minimum and maximum values noted above. For example, the surface area can be within a range of between at least about 20.2 cm² to no greater than about 730.6 cm², within a range of between at least about 45.4 cm² to no greater than about 615.8 cm², within a range of at least about 78.5 cm² to no greater than 506.7 cm², or within a range of at least about 176.6 cm² to no greater than about 415.5 cm².

In one particular aspect of the present embodiments, the body can have an average surface roughness ($R_a$) of the upper surface and/or the rear surface of not greater than about 1 micron, not greater than about 0.1 microns, not greater than about 0.05 microns, not greater than about 0.01 microns, not greater than about 0.001 microns (1 nm) or even not greater than about 0.0001 microns (0.1 nm), for an area of 100×100 μm².

Notably, the body of the semiconductor substrate can be formed to have a particular crystalline bow. Notably, while the physical bow can be directly measured through metrology, the crystalline bow can be derived from the measurement of the crystalline radius of curvature by X-ray diffraction. The physical bow and the crystalline bow can be the same, and more often, depending upon the finishing process, can be significantly different.

The crystalline bow is measured as the curvature of the crystalline material within the body of the semiconductor substrate as a deviation from a perfectly planar crystalline morphology. A measure of the crystal is performed by X-ray diffraction following methods disclosed in Chapter 4.3.5 in the book "X-ray scattering from semiconductors" by Paul F. Fewster, based on the formula 4.12 for deriving the radius of curvature $\rho=(x_1-x_2)/(\omega 1-\omega 2)$, wherein "ρ" is the radius of curvature, "x" is the position on the sample, and "ω" is the angular position of the maximum of the diffraction peak in ω-scan at this position. That is, for example, the curvature of the body can be notably low, demonstrating substantially little to no bowing. According to one embodiment, the body can have a crystalline bow that is less than about 200 microns. In other instances, the bow can be less, such as not greater than about 100 microns, not greater than about 75 microns, not greater than about 50 microns, not greater than about 25 microns, not greater than about 10 microns or even not greater than about 2 microns. The radius of curvature ρ can be measured via X-Ray diffractometry using X'Pert Pro PANalytical equipment. For a 2-inch diameter wafer the radius of curvature (p) is determined from 9 ω-scan peak positions over a range of 40 mm along a diameter.

According to another embodiment, a production lot of free-standing substrates can be formed using the methods of embodiments herein. In particular, a production lot can include at least 10 substrates, at least 20 substrates, or at least 50 substrates, which may be chosen at random from a larger cache of substrates. The production lot may include, but need not necessarily include, a series of substrates, which were formed using the same process and intended to have the same geometric and crystalline characteristics. In certain embodiments, the production lot can include at least 10 substrates, at least 20 substrates, at least 50 substrates, at least 100 substrates, at least 500 substrates, or at least 1000 substrates. Each of the substrate has those characteristics described herein. For particular embodiments, a production lot of at least 20 substrates can be formed, wherein each of the substrates has those characteristics described herein.

Additionally, the production lot as a whole, can have particular characteristics. For example, the production lot of substrates can have a lot standard deviation of offcut angle that is not greater than about 1 degree. The lot standard deviation of offcut angle can be a standard deviation based on the average offcut angle (α) for each of the substrates in the production lot. That is, for every substrate, an average offcut angle (α) is calculated and a standard deviation is calculated from the average offcut angle calculated for each of the 20 substrates at the center of each substrate. In another embodiment, the production lot comprises a lot standard deviation of offcut angle (STα) of not greater than about 0.05 degrees, not greater than about 0.03 degrees, not greater than about 0.02 degrees, not greater than about 0.01 degrees, not greater than about 0.005 degrees, or not greater than about 0.001 degrees. Still, in certain instances, the lot standard deviation of offcut angle can be at least about 0.0001 degrees or at least about 0.0005 degrees. It will be appreciated that the lot standard deviation of offcut angle can be within a range between any of the minimum and maximum values noted above.

The production lot of substrates can also have a standard deviation of the offcut angle variation (ST2β). The standard deviation of the offcut angle variation (ST2β) for the production lot is the standard deviation of the average offcut angle variation (2β) for each of the 20 substrates in the production lot. That is, for every substrate, the offcut angle variation (2β) can be calculated, and from the average offcut angle variation (2β) for each of the 20 substrates, a standard deviation of the average offcut angle variation (ST2β) can be calculated for the entire production lot. In one embodiment, the production lot can have a lot standard deviation of offcut angle variation of not greater than about 1 degree, no greater than about 0.95 degree, no greater than about 0.9 degree, no greater than about 0.85 degree, no greater than about 0.8 degree, no greater than about 0.75 degree, no greater than about 0.7 degree, no greater than about 0.6 degree, no greater than about 0.4 degree, no greater than 0.1 degrees, not greater than about 0.09 degrees, not greater than about 0.05 degrees, not greater than about 0.03 degrees, not greater than about 0.01 degrees, not greater than about 0.008 degrees, not greater than about 0.005 degrees, or not greater than about 0.001 degrees. Still, in certain instances, the standard deviation of offcut angle variation for the production lot can be at least about 0.0001 degrees or at least about 0.0005 degrees. It will be appreciated that the offcut angle variation of the production lot can be within a range between any of the minimum and maximum values noted above.

The production lot of substrates can also have an average lot diameter. The average lot diameter can be an average of the diameter of each substrate in the lot. In some embodiments, the production lot can have an average lot diameter of the substrates of at least about 2 inches (5.1 cm), at least about 3 inches (7.6 cm), at least about 4 inches (10 cm), at least about 5 inches (12.7 cm), or at least about 6 inches (15 cm). In further embodiments, the production lot can have an average lot diameter of no greater than about 12 inches (approximately 30.5 cm), no greater than about 11 inches (approximately 27.9 cm), no greater than about 10 inches (approximately 25.4 cm), or no greater than about 9 inches (approximately 22.9 cm). It will be appreciated that the production lot can have an average lot substrate diameter within a range of between any of the minimum and maximum values noted above. For example, the production lot can have an average lot diameter of the substrates within a range of between at least about 2 inches (approximately 5.1 cm) to no greater than about 12 inches (approximately 30.5 cm), within a range of between at least about 3 inches (approximately 7.6 cm) to no greater than about 11 inches (approximately 27.9 cm), within a range of between at least about 4 inches (approximately 10 cm) to no greater than about 10 inches (approximately 25.4 cm), or within a range of between at least about 5 inches (approximately 12.7 cm) to no greater than 9 inches (approximately 22.9 cm).

The production lot of substrates can also have an average lot surface area. The average lot surface area can be an average of the surface area of each substrate in the lot. In some embodiments, the production lot can have an average lot surface area of at least about 20.2 cm$^2$, at least about 45.4 cm$^2$, at least about 78.5 cm$^2$, at least about 126.7 cm$^2$, or at least about 176.6 cm$^2$. In further embodiments, the production lot can have an average lot surface area of no greater than about 730.6 cm$^2$, no greater than about 615.8 cm$^2$, no greater than about 506.7 cm$^2$, no greater than about 415.5 cm$^2$. It will be appreciated that the average lot surface area can be within a range of between any of the minimum and maximum values noted above. For example, the production lot can have an average surface area within a range of between at least about 20.2 cm$^2$ to no greater than about 730.6 cm$^2$, within a range of between at least about 45.4 cm$^2$ to no greater than about 615.8 cm$^2$, within a range of at least about 78.5 cm$^2$ to no greater than 506.7 cm$^2$, or within a range of at least about 176.6 cm$^2$ to no greater than about 415.5 cm$^2$.

In certain embodiments, the production lot can include a plurality of substrates, wherein each substrate can include a thin buffer layer overlying each substrate of the production lot. Each of the buffer layers was formed using the same process and intended to have the same geometric and crystalline characteristics as described herein. In accordance with these embodiments, the production lot can have an average lot buffer layer thickness. The average lot buffer layer thickness is the average of the thickness of each buffer layer. According to another embodiment, the average lot buffer layer thickness can be not greater than about 1.2 µm, not greater than about 1.1 µm, not greater than about 1.0 µm, not greater than about 0.9 µm, not greater than about 0.8 µm, not greater than about 0.7 µm, not greater than about 0.6 µm, not greater than about 0.5 µm, not greater than about 0.4 µm or not greater than about 0.3 µm. According to yet another embodiment, the average lot buffer layer thickness can be at least about 0.02 µm, at least about 0.04 µm, at least about 0.08 µm, at least about 0.1 µm, at least about 0.2 µm or at least about 0.3 µm. It will be appreciated that the average lot buffer layer thickness can be within a range of between any of the minimum and maximum values noted above. For example, the average lot thickness of the buffer layers can be within a range of between at least about 0.02 µm to no greater than about 1.2 µm, within a range of between at least about 0.05 µm to no greater than about 1.1 µm, within a range of between at least about 0.08 µm to no greater than about 1.0 µm, within a range of between at least about 0.1 µm to no greater than about 0.8 µm, or within a range of between at least about 0.2 to no greater than about 0.5 µm. In a particular, yet non-limiting embodiment, the average lot buffer layer thickness is about 0.3 µm.

It has been noted that the incorporation of certain species, such as indium (In) in semiconducting materials (e.g., GaN) can vary with the off cut angle (α). In fact, as the offcut angle increases the indium incorporation efficiency can decrease. Indium composition in In$_x$Ga$_{1-x}$N alloys determine the emission wavelength in light emitting as well as in laser diodes structures (LEDs & LDs). According to industry standards, the wavelength variation range should not exceed 2 nm across a wafer and the standard deviation should be less than 1 nm. According to reported results on sapphire substrates a 0.5° in the offcut angle induces a LED wavelength change of 10 nm which is not acceptable for blue LED production. Therefore, in order to control LED light emission wavelength range within 1 nm on the entire wafer, the offcut angle variation across the sapphire substrates is controlled to be less than 0.2 degrees (+/−0.1 degrees) independent of the substrate size. According to an embodiment, a plurality of electronic structures can be formed on the free standing substrate described herein. The electronic structures can include optoelectronic devices, such as light emitting diodes (LEDs), laser diodes (LDs), or other microelectronic structures configured to emit a particular wavelength of light. In certain embodiments, the electronic structures, such as optoelectronic devices, formed on the substrate can have a light emission wavelength standard deviation (σ). The light emission wavelength standard deviation can be measured by methods known in the art, for example photoluminescences (PL). According to an embodiment, PL mapping can be performed on the LED structures formed on the substrate at room temperature. LED structures can emit in the visible spectrum. The light emission wavelength can be within a range of between about 400 nm to about 550 nm. Shift of the wavelength of the maximum emission intensity can be precisely measured and the light emission wavelength standard deviation can be determined.

According to another embodiment, the light emission wavelength standard deviation can be not greater than about 1.3 nm, not greater than about 1.2 nm, not greater than about 1.1 nm, not greater than about 1 nm, not greater than about 0.9 nm, or not greater than about 0.8 nm. According to another embodiment, the light emission wavelength standard deviation (σ) can be at least about 0.01 nm, at least about 0.05 nm, at least about 0.1 nm, at least about 0.2 nm, at least about 0.3 nm, or at least about 0.5 nm. It will be appreciated that the wavelength standard deviation can be within a range of between any minimum and maximum values noted above. For example, the light emission wavelength standard deviation (σ) can be within a range of between at least about 0.01 nm to no greater than about 1.3 nm, within a range of between at least about 0.05 nm to at least about 1.2 nm, within a range of between at least about 0.1 nm to no greater than about 1 nm, or within a range of between at least about 0.2 nm to no greater than about 0.9 nm.

In another embodiment, the optoelectronic devices formed on the substrate can have a normalized light emission wavelength standard deviation (nσ) at a wavelength within a range of between about 400 nm to about 550 nm.

The normalized light emission wavelength standard deviation is the emission wavelength standard deviation (σ) normalized for the surface area of the substrate. According to an embodiment, the normalized light emission wavelength standard deviation (nσ) can be not greater than about 0.0641 nm/cm$^2$, not greater than about 0.0588 nm/cm$^2$, not greater than about 0.0539 nm/cm$^2$, not greater than about 0.0490 nm/cm$^2$, not greater than about 0.0441 nm/cm$^2$, or not greater than about 0.0392 nm/cm$^2$. According to another embodiments, the normalized light emission wavelength standard deviation can be at least about 1.4×10$^{-5}$ nm/cm$^2$, at least about 1.6×10$^{-5}$ nm/cm$^2$, at least about 2.0×10$^{-5}$ nm/cm$^2$, or at least about 2.4×10$^{-5}$ nm/cm$^2$. It will be appreciated that the normalized light emission wavelength standard deviation can be within a range of between any minimum and maximum values noted above. For example, the normalized light emission wavelength standard deviation can be within a range of between at least about 1.4×10$^{-5}$ nm/cm$^2$ to no greater than about 0.0641 nm/cm$^2$, within a range of between at least about 1.6×10$^{-5}$ nm/cm$^2$ to no greater than about 0.0588 nm/cm$^2$, within a range of between at least about 2.0×10$^{-5}$ nm/cm² to no greater than about 0.0539 nm/cm², or within a range of between at least about $2.4\times10^{-5}$ nm/cm² to no greater than about 0.0490 nm/cm².

According to another embodiment, electronic structures may be formed on the upper surface of the buffer layer on the free-standing substrate as described herein. According to an alternative embodiment, the electronic structures are formed on an epitaxial layer overlying the upper surface of the buffer layer. The electronic structures can include optoelectronic structures, such as LEDs or LDs, or microelectronic structures such as transistors. In certain embodiments, an optoelectronic structure can include a plurality of optoelectronic devices formed on the free standing substrate having a buffer layer as described herein. According to an embodiment, the plurality of optoelectronic devices formed on the upper surface of the buffer layer can be in direct contact with the buffer layer.

According to an embodiment, a plurality of optoelectronic devices can be formed on each substrate of the production lot of the substrates described herein. In a further embodiment, at wavelength within a range of between about 400 nm to 550 nm the production lot can have emission standard deviation of not greater than about 1.3 nm, such as, not greater than about 1.2 nm, not greater than about 1.1 nm, not greater than about 1 nm, not greater than about 0.9 nm, or not greater than about 0.8 nm. In another embodiment, the lot light emission wavelength standard deviation ($\sigma$) can be at least about 0.01 nm, at least about 0.05 nm, at least about 0.1 nm, at least about 0.2 nm, at least about 0.3 nm, or at least about 0.5 nm. It will be appreciated that the lot light emission wavelength standard deviation ($\sigma$) can be within a range of between at least about 0.01 nm to no greater than about 1.3 nm, within a range of between at least about 0.05 nm to at least about 1.2 nm, within a range of between at least about 0.1 nm to no greater than about 1 nm, or within a range of between at least about 0.2 to no greater than about 0.9 nm.

According to another embodiment, a production lot of substrates having a plurality of optoelectronic devices formed on each substrate can have a normalized lot light emission wavelength standard deviation not greater than about 0.0641 nm/cm² at wavelength within a range of between about 400 nm to 550 nm, such as no greater than about 0.0588 nm/cm², no greater than about 0.0539 nm/cm², no greater than about 0.0490 nm/cm², no greater than about 0.0441 nm/cm², or no greater than about 0.0392 nm/cm². In yet another embodiment, at least about $7.9\times10^{-7}$ nm/cm², at least about $1.2\times10^{-6}$ nm/cm², at least about $2.2\times10^{-6}$ nm/cm², or at least about $4.9\times10^{-6}$ nm/cm². It will be appreciated that the normalized lot light emission standard deviation can be within a range of between any of the minimum and maximum values noted above.

Many different aspects and embodiments are possible. Some of those aspects and embodiments are described herein. After reading this specification, skilled artisans will appreciate that those aspects and embodiments are only illustrative and do not limit the scope of the present invention. Additionally, those skilled in the art will understand that some embodiments that include analog circuits can be similarly implemented using digital circuits, and vice versa. Embodiments may be in accordance with any one or more of the items as listed below.

Item 1. A substrate comprising a Group III-V material and having an upper surface, the substrate comprising an offcut angle ($\alpha$) defined between the upper surface and a crystallographic reference plane, the substrate further comprising an offcut angle variation ($2\beta$) of no greater than 1 degree.

Item 2. A substrate comprising: a body comprising a Group III-V material and having an upper surface, the body comprising an offcut angle ($\alpha$) defined between the upper surface and a crystallographic reference plane, the body further comprising an offcut angle variation ($2\beta$); a buffer layer comprising a Group III-V material adjacent the upper surface of the body, wherein the buffer layer has an average thickness of no greater than about 1.3 μm.

Item 3. A substrate comprising: a body comprising a Group III-V material and having an upper surface, the body comprising an offcut angle ($\alpha$) defined between the upper surface and a crystallographic reference plane, the body further comprising an offcut angle variation ($2\beta$); a buffer layer comprising a Group III-V material adjacent the upper surface of the body, wherein the buffer layer has an upper surface, the buffer layer and body comprising an offcut angle ($\alpha$) defined between the upper surface of the buffer layer and a crystallographic reference plane, the buffer layer and body further comprising an offcut angle variation ($2\beta$) which is less than the offcut angle variation ($2\beta$) of the body.

Item 4. The substrate of any one of items 2-3, wherein the body is a finished body.

Item 5. The substrate of any one of the preceding items, wherein the substrate further comprising a plurality of optoelectronic devices disposed adjacent the upper surface of the buffer layer, wherein the plurality of optoelectronic devices have an average light emission wavelength standard deviation of not greater than 1.3 nm.

Item 6. The substrate of item 5, wherein the plurality of optoelectronic devices have an average light emission wavelength standard deviation of not greater than not greater than 1.2 nm, not greater than 1 nm, not greater than 0.9 nm, or even not greater than 0.8 nm.

Item 7. The substrate of item 6, wherein the plurality of optoelectronic devices have an average light emission wavelength standard deviation of not greater than about 1 nm.

Item 8. The substrate of any one of the preceding items, wherein the offcut angle ($\alpha$) of the body and buffer layer is not greater than about 2 degrees, not greater than about 1.5 degrees, not greater than about 1 degree, not greater than about 0.8 degree, not greater than about 0.6 degrees, not greater than about 0.4 degrees or not greater than about 0.2 degrees.

Item 9. The substrate of any one of the preceding items, wherein the offcut angle ($\alpha$) of the body and buffer layer is at least about 0.1 degrees, at least about 0.2 degrees, at least about 0.3 degrees or even at least about 0.6 degrees.

Item 10. The substrate of any one of the preceding items, wherein the offcut angle variation ($2\beta$) of the body and buffer layer is not greater than about 1 degree, no greater than about 0.95 degree, no greater than about 0.9 degree, no greater than about 0.85 degree, no greater than about 0.8 degree, no greater than about 0.75 degree, no greater than about 0.7 degree, no greater than about 0.6 degree, no greater than about 0.4 degree, no greater than about 0.2 degrees, not greater than about 0.16 degrees, not greater than about 0.14 degrees, or even not greater than about 0.1 degrees, not greater than about 0.08 degrees, or even not greater than about 0.06 degrees.

Item 11. The substrate of any one of the preceding items, wherein the offcut angle variation ($2\beta$) of the body and buffer layer is at least about 0.005 degrees or at least about 0.008 degrees.

Item 12. The substrate of any one of the preceding items, wherein the body comprises nitrogen.

Item 13. The substrate of any one of the preceding items, wherein the body comprises gallium.

Item 14. The substrate of any one of the preceding items, wherein the body comprises gallium nitride.

Item 15. The substrate of item 14, wherein the body consists essentially of gallium nitride.

Item 16. The substrate of any one of the preceding items, wherein the body comprises an average thickness of not greater than about 3 mm, not greater than about 2 mm, not greater than about 1 mm, not greater than about 800 microns, not greater than about 500 microns, not greater than about 400 microns, not greater than about 300 microns, not greater than about 200 microns or not greater than about 100 microns.

Item 17. The substrate of any one of the preceding items, wherein the buffer layer comprises nitrogen.

Item 18. The substrate of any one of the preceding items, wherein the buffer layer comprises gallium.

Item 19. The substrate of any one of the preceding items, wherein the buffer layer comprises gallium nitride.

Item 20. The substrate of any one of the preceding items, wherein the buffer layer consists essentially of gallium nitride.

Item 21. The substrate of any one of the preceding items, wherein the upper surface of the body comprises a Ga-face of a GaN crystal.

Item 22. The substrate of any one of the preceding items, wherein the upper surface of the buffer layer comprises a Ga-face of a GaN crystal.

Item 23. The substrate of any one of the preceding items wherein the crystallographic reference plane comprises a plane selected from the group of planes consisting of a-plane, m-plane, r-plane, c-plane and semi polar planes.

Item 24. The substrate of item 23, wherein the crystallographic reference plane is a c-plane.

Item 25. The substrate of any one of the preceding items, wherein the crystallographic reference plane is tilted toward a crystallographic plane selected from the group of planes consisting of a-plane, r-plane, m-plane and c-plane.

Item 26. The substrate of any one of the preceding items, wherein the body and buffer layer comprises a bow defining a radius of curvature of at least about 3 m, at least about 5 m, at least about 10 m, at least about 50 m, at least about 100 m, or even at least about 200 m.

Item 27. The substrate of any one of the preceding items, wherein the body comprises a diameter of at least about 2 inches (5.1 cm), at least about 3 inches (7.6 cm), at least about 4 inches (10 cm).

Item 28. The substrate of any one of the preceding items, wherein the upper surface of the buffer layer comprises an average surface roughness of not greater than about 1 micron, not greater than about 0.1 microns, not greater than about 0.05 microns, not greater than about 0.001 microns or even not greater than about 0.0001 microns (0.1 nm).

Item 29. The substrate of any one of the preceding items, wherein the upper surface of the body comprises a defect density of not greater than about $1 \times 10^8$ cm$^{-2}$, not greater than about $5 \times 10^7$ cm$^{-2}$, not greater than about $1 \times 10^7$ cm$^{-2}$, not greater than about $5 \times 10^6$ cm$^{-2}$ or not greater than about $1 \times 10^6$ cm$^{-2}$.

Item 30. A production lot of substrates comprising at least 20 substrates, each of the substrates in the lot comprising a Group III-V material and having an upper surface, the body comprising an offcut angle ($\alpha$) defined between the upper surface and a crystallographic reference plane, the substrate further comprising an offcut angle variation ($2\beta$) of not greater than about 1 degrees.

Item 31. A production lot of substrates comprising at least 20 substrates, each of the substrates in the lot comprising a Group III-V material and having an upper surface, the body comprising an offcut angle ($\alpha$) defined between the upper surface and a crystallographic reference plane, the substrate further comprising an offcut angle variation ($2\beta$) of not greater than about 1 degree.

Item 32. The production lot of substrates of any one of items 30-31, wherein the body and buffer layer of each of the substrates in the production lot comprises nitrogen.

Item 33. The production lot of substrates of any one of items 30-32, wherein the body and buffer layer of each of the substrates in the production lot comprises gallium.

Item 34. The production lot of substrates of any one of items 30-33, wherein the body and buffer layer of each of the substrates in the production lot comprises gallium nitride.

Item 35. The production lot of substrates of any one of items 30-34, wherein the body and buffer layer of each of the substrates in the production lot comprises a bow defining a radius of curvature of at least about 1.5 m, at least about 1.8 m, at least about 2 m, at least about 2.5 m, at least about 3 m, at least about 5 m, at least about 10 m, at least about 50 m, at least about 100 m, or even at least about 200 m.

Item 36. The production lot of substrates of any one of items 30-35, wherein the body and buffer layer of each of the substrates in the production lot comprises a total thickness variation (TTV) of not greater than about 3 μm.

Item 37. The production lot of substrates of any one of items 30-36, wherein the body of each of the substrates in the production lot comprises a diameter of at least about 2 inches (5.1 cm), at least about 3 inches (7.6 cm), at least about 4 inches (10 cm)

Item 38. The production lot of substrates of any one of items 30-37, wherein the offcut angle variation ($2\beta$) is not greater than about 1 degree, no greater than about 0.95 degree, no greater than about 0.9 degree, no greater than about 0.85 degree, no greater than about 0.8 degree, no greater than about 0.75 degree, no greater than about 0.7 degree, no greater than about 0.6 degree, no greater than about 0.4 degree, no greater than about 0.16 degrees, not greater than about 0.14 degrees, or even not greater than about 0.1 degrees, not greater than about 0.08 degrees, or even not greater than about 0.06 degrees.

Item 39. The production lot of substrates of any one of items 30-38, wherein the offcut angle variation ($2\beta$) is at least about 0.005 degrees or at least about 0.008 degrees.

Item 40. The production lot of substrates of any one of items 30-39, wherein the offcut angle ($\alpha$) is not greater than about 2 degrees, not greater than about 1.5 degrees, not greater than about 1 degree, not greater than about 0.8 degree or not greater than about 0.6 degrees.

Item 41. The production lot of substrates of any one of items 30-40, wherein the offcut angle ($\alpha$) is at least about 0.1 degrees, at least about 0.2 degrees, at least about 0.3 degrees or even at least about 0.6 degrees.

Item 42. The production lot of substrates of any one of items 30-41, wherein the production lot comprises a lot standard deviation of offcut angle (ST$\alpha$) of no greater than about 0.05 degrees, not greater than about 0.03 degrees, not greater than about 0.02 degrees, not greater than about 0.01 degrees, not greater than about 0.005 degrees, or not greater than about 0.001 degrees, and at least about 0.0001 degrees or at least about 0.0005 degrees.

Item 43. The production lot of substrates of any one of items 30-42, wherein the production lot comprises a standard deviation of offcut angle variation (ST$2\beta$) between all of the substrates in the lot of not greater than about 1 degree, no greater than about 0.95 degree, no greater than about 0.9 degree, no greater than about 0.85 degree, no greater than about 0.8 degree, no greater than about 0.75 degree, no greater than about 0.7 degree, no greater than about 0.6 degree, no greater than about 0.4 degree, not greater than about 0.1 degrees, not greater than about 0.09 degrees, not greater than about 0.05 degrees, not greater than about 0.03 degrees, not greater than about 0.01 degrees, not greater than about 0.008 degrees, not greater than about 0.005 degrees, or not greater than about 0.001 degrees, and at least about 0.0001 degrees or at least about 0.0005 degrees.

Item 44. An optoelectronic structure comprising a plurality of optoelectronic devices formed on a substrate comprising Group III-V material and having an upper surface, the substrate comprising an offcut angle ($\alpha$) defined between the upper surface and a crystallographic reference plane, the substrate further comprising an offcut angle variation ($2\beta$), wherein the plurality of optoelectronic structures has an average light wavelength standard deviation of not greater than 1.3 nm.

Item 45. The optoelectronic structure of item 44, wherein the plurality of optoelectronic devices have an average light emission wavelength standard deviation of not greater than not greater than 1.3 nm, not greater than 1.2 nm, not greater than 1 nm, not greater than 0.9 nm, or even not greater than 0.8 nm.

Item 46. A method of forming a substrate comprising: providing a body comprising a Group III-V material, the body having an upper surface and a rear surface opposite the upper surface, wherein the upper surface of the body has an arrangement of terraces and step risers; performing at least one finishing operation on the upper surface of the body; and forming a buffer layer comprising a Group III-V material on the upper surface of the body, the buffer layer having an upper surface and a rear surface adjacent the body, wherein the upper surface of the buffer layer has a more uniform arrangement of the terraces and step risers than the upper surface of the body.

Item 47. The method of any one of item 46, wherein after forming of the buffer layer, the body comprises an offcut angle defined between the upper surface and a crystallographic reference plane.

Item 48. The method of any item 47, wherein after forming the buffer layer, the offcut angle ($\alpha$) is not greater than about 2 degrees, not greater than about 1.5 degrees, not greater than about 1 degree, not greater than about 0.8 degree or not greater than about 0.6 degrees.

Item 49. The method any one of items 46-48, wherein after forming the buffer layer the substrate comprises an offcut angle variation ($2\beta$) of not greater than about 1 degree, not greater than about 0.8 degrees, not greater than about 0.6 degrees, not greater than about 0.5 degrees, not greater than about 0.4 degrees, not greater than about 0.3 degrees, not greater than about 0.2 degrees, not greater than about 0.16 degrees, not greater than about 0.14 degrees, or even not greater than about 0.1 degrees, not greater than about 0.08 degrees, or even not greater than about 0.06 degrees.

Item 50. The method of any one of items 46-49, further comprising forming the body via an epitaxial growth of the Group III-V material.

Item 51. The method of item 50, wherein forming the body includes heteroepitaxial growth of Group III-V material on a substrate.

Item 52. The method of any one of the preceding items, wherein the buffer layer is formed by epitaxial deposition.

Item 53. The method of any one of the preceding items, wherein the buffer layer is formed by a MOCVD process.

Item 54. The method of any one of the preceding items, wherein the buffer layer is formed in a 2-D growth mode.

Item 55. A substrate comprising: a body comprising a Group III-V material and having an upper surface; and a buffer layer comprising a Group III-V material adjacent the upper surface of the body, wherein the buffer layer has an average thickness within a range of between at least about 0.01 μm to not greater than about 1.3 μm.

Item 56. The substrate of item 55, wherein the buffer layer has an average thickness of not greater than about 1.2 μm, not greater than about 1.1 μm, not greater than about 1.0 μm, not greater than about 0.9 μm, not greater than about 0.8 μm, not greater than about 0.7 μm, not greater than about 0.6 μm, not greater than about 0.5 μm, not greater than about 0.4 μm or not greater than about 0.3 μm.

Item 57. The substrate of item 55, wherein the buffer layer has an average thickness of at least about 0.02 μm, at least about 0.04 μm, at least about 0.08 μm, at least about 0.1 μm, at least about 0.2 μm or at least about 0.3 μm.

Item 58. The substrate of item 55, wherein the buffer layer has an average thickness within a range of between at least about 0.02 μm to not greater than about 1.2 μm, within a range of between at least about 0.04 μm to not greater than about 1.1 μm, within a range of between at least about 0.08 μm to not greater than about 1.0 μm, or within a range of between at least about 0.1 μm to no greater than about 0.8 μm.

Item 59. The substrate of item 55, wherein the buffer layer is in direct contact with the body.

Item 60. The substrate of item 55, wherein the body comprises nitrogen.

Item 61. The substrate of item 55, wherein the body comprises gallium.

Item 62. The substrate of item 55, wherein the body comprises gallium nitride.

Item 63. The substrate of item 55, wherein the buffer layer comprises gallium nitride.

Item 64. The substrate of item 55, wherein the buffer layer consists essentially of gallium nitride.

Item 65. A substrate structure comprising: a substrate comprising a Group III-V material having an upper surface; and a plurality of optoelectronic devices overlying the upper surface of the substrate, wherein the plurality of optoelectronic devices overlying the upper surface of the substrate have a normalized light emission wavelength standard deviation ($n\sigma$) of not greater than about 0.0641 nm/cm$^2$ at a wavelength within a range of between about 400 nm to about 550 nm.

Item 66. The substrate structure of item 65, wherein $n\sigma$ is light emission wavelength standard deviation normalized for surface area of the substrate, the substrate having a diameter of at least about 2 inches (5.1 cm).

Item 67. The substrate of item 65, wherein the substrate has a diameter of at least about 2 inches (5.1 cm), at least about 3 inches (7.6 cm), at least about 4 inches (10 cm), at least about 5 inches (12.7 cm), or at least about 6 inches (15 cm).

Item 68. The substrate of item 65, wherein the substrate has a diameter of no greater than about 12 inches (approximately 30.5 cm), no greater than about 11 inches (approximately 27.9 cm), no greater than about 10 inches (approximately 25.4 cm), or no greater than about 9 inches (approximately 22.9 cm).

Item 69. The substrate of item 65, wherein the substrate has a diameter within a range of between at least about 2 inches (approximately 5.1 cm) to no greater than about 12 inches (approximately 30.5 cm), within a range of between at least about 3 inches (approximately 7.6 cm) to no greater than about 11 inches (approximately 27.9 cm), within a range of between at least about 4 inches (approximately 10 cm) to no greater than about 10 inches (approximately 25.4 cm), or within a range of between at least about 5 inches (12.7 cm) to no greater than 9 inches (approximately 22.9 cm).

Item 70. The substrate of item 65, wherein the substrate has a surface area of at least about 20.2 cm$^2$, at least about 45.4 cm$^2$, at least about 78.5 cm$^2$, at least about 126.7 cm$^2$, or at least about 176.6 cm$^2$.

Item 71. The substrate of item 65, wherein the substrate has a surface area of no greater than about 730.6 cm$^2$, no greater than about 615.8 cm$^2$, no greater than about 506.7 cm$^2$, no greater than about 415.5 cm$^2$.

Item 72. The substrate of item 65, wherein the substrate has a surface area within a range of between at least about 20.2 cm$^2$ to no greater than about 730.6 cm$^2$, within a range of between at least about 45.4 cm$^2$ to no greater than about 615.8 cm$^2$, within a range of at least about 78.5 cm$^2$ to no greater than 506.7 cm$^2$, or within a range of at least about 176.6 cm$^2$ to no greater than about 415.5 cm$^2$.

Item 73. The substrate of item 65, wherein the light emission wavelength standard deviation is not greater than about 1.3 nm, not greater than about 1.2 nm, not greater than about 1.1 nm, not greater than about 1 nm, not greater than about 0.9 nm, or not greater than about 0.8 nm.

Item 74. The substrate of item 65, wherein the light emission wavelength standard deviation ($\sigma$) is at least about 0.01 nm, at least about 0.05 nm, at least about 0.1 nm, at least about 0.2 nm, at least about 0.3 nm, or at least about 0.5 nm.

Item 75. The substrate of item 65, wherein the light emission wavelength standard deviation ($\sigma$) is within a range of between at least about 0.01 nm to no greater than about 1.3 nm, within a range of between at least about 0.05 nm to at least about 1.2 nm, within a range of between at least about 0.1 nm to no greater than about 1 nm, or within a range of between at least about 0.2 to no greater than about 0.9 nm.

Item 76. The substrate of item 65, wherein n$\sigma$ is no greater than about 0.0588 nm/cm$^2$, no greater than about 0.0539 nm/cm$^2$, no greater than about 0.0490 nm/cm$^2$, no greater than about 0.0441 nm/cm$^2$, or no greater than about 0.0392 nm/cm$^2$.

Item 77. The substrate of item 65, wherein n$\sigma$ is at least about $1.4 \times 10^{-5}$ nm/cm$^2$, at least about $1.6 \times 10^{-5}$ nm/cm$^2$, at least about $2.0 \times 10^{-5}$ nm/cm$^2$, or at least about $2.4 \times 10^{-5}$ nm/cm$^2$.

Item 78. The substrate of item 65, wherein n$\sigma$ is within a range of between at least about $1.4 \times 10^{-5}$ nm/cm$^2$ to no greater than about 0.0641 nm/cm$^2$, within a range of between at least about $1.6 \times 10^{-5}$ nm/cm$^2$ to no greater than about 0.0588 nm/cm$^2$, within a range of between at least about $2.0 \times 10^{-5}$ nm/cm$^2$ to no greater than about 0.0539 nm/cm$^2$, or within a range of between at least about $2.4 \times 10^{-5}$ nm/cm$^2$ to no greater than about 0.0490 nm/cm$^2$.

Item 79. The substrate of item 65, comprising a buffer layer adjacent the upper surface of the Group III-V material, wherein the buffer layer has an average thickness within a range of between at least about 0.01 μm to not greater than about 1.3 μm.

Item 80. The substrate of item 65, wherein the substrate comprises nitrogen.

Item 81. The substrate of item 65, wherein the substrate comprises gallium.

Item 82. The substrate of item 79, wherein the buffer layer comprises gallium nitride.

Item 83. The substrate of item 79, wherein the buffer layer consists essentially of gallium nitride.

Item 84. The substrate of item 79, wherein the buffer layer has a thickness within a range of between at least about 0.02 μm to no greater than about 1.2 μm, within a range of between at least about 0.04 μm to no greater than about 1.1 μm, within a range of between at least about 0.08 μm to no greater than about 1.0 μm, within a range of between at least about 0.1 μm to no greater than about 0.8 μm, or within a range of between at least about 0.2 to no greater than about 0.5 μm.

Item 85. The substrate of item 65, wherein the plurality of optoelectronic devices comprises a Group III-V material.

Item 86. The substrate of item 65, wherein the plurality of optoelectronic devices comprises an alloy.

Item 87. The substrate of item 65, wherein the plurality of optoelectronic devices comprises In$_x$Ga$_{1-x}$N, 0<X<1.

Item 88. A substrate comprising: a body comprising a Group III-V material and having an upper surface; and a buffer layer comprising a Group III-V material overlying the upper surface of the body having an average thickness within a range of between at least about 0.01 μm to no greater than about 1.3 μm; wherein the substrate is configured to provide a surface for the formation of a plurality of optoelectronic devices overlying the buffer layer and having a normalized light emission wavelength standard deviation (n$\sigma$) of no greater than about 0.0641 nm/cm$^2$ at a wavelength within a range of between about 420 nm to about 500 nm.

Item 89. The substrate of item 88, wherein the buffer layer has a thickness within a range of between at least about 0.02 μm to no greater than about 1.2 μm, within a range of between at least about 0.04 μm to no greater than about 1.1 μm, within a range of between at least about 0.08 μm to no greater than about 1.0 μm, within a range of between at least about 0.1 μm to no greater than about 0.8 μm, or within a range of between at least about 0.2 to no greater than about 0.5 μm.

Item 90. The substrate of item 88, wherein n$\sigma$ is light emission wavelength standard deviation normalized for surface area of the substrate, the substrate having a diameter of at least about 2 inches (5.1 cm).

Item 91. The substrate of item 90, wherein the light emission wavelength standard deviation is not greater than about 1.3 nm, not greater than about 1.2 nm, not greater than about 1.1, not greater than about 1 nm, not greater than about 0.9 nm or not greater than about 0.8 nm.

Item 92. The substrate of item 90, wherein the light emission wavelength standard deviation is at least about 0.01 nm, at least about 0.05 nm, at least about 0.1 nm, at least about 0.2 nm, at least about 0.3 nm, or at least about 0.5 nm.

Item 93. The substrate of item 90, wherein the light emission wavelength standard deviation is within a range of between at least about 0.01 nm to no greater than about 1.3 nm, within a range of between at least about 0.05 nm to no greater than about 1.2 nm, within a range of between at least about 0.1 nm to no greater than about 1.1 nm, or within a range of between at least 0.2 nm to no greater than about 1 nm.

Item 94. The substrate of item 90, wherein n$\sigma$ is no greater than about 0.0588 nm/cm$^2$, no greater than about 0.0539 nm/cm$^2$, no greater than about 0.0490 nm/cm$^2$, no greater than about 0.0441 nm/cm$^2$, or no greater than about 0.0392 nm/cm$^2$.

Item 95. The substrate of item 90, wherein n$\sigma$ is at least about $1.4 \times 10^{-5}$ nm/cm$^2$, at least about $1.6 \times 10^{-5}$ nm/cm$^2$, at least about $2.0 \times 10^{-5}$ nm/cm$^2$, or at least about $2.4 \times 10^{-5}$ nm/cm$^2$.

Item 96. The substrate of item 90, wherein n$\sigma$ is within a range of between at least about $1.4 \times 10^{-5}$ nm/cm$^2$ to no greater than about 0.0641 nm/cm$^2$, within a range of between at least about $1.6 \times 10^{-5}$ nm/cm$^2$ to no greater than about 0.0588 nm/cm$^2$, within a range of between at least about $2.0 \times 10^{-5}$ nm/cm$^2$ to no greater than about 0.0539 nm/cm$^2$, or within a range of between at least about $2.4 \times 10^{-5}$ nm/cm$^2$ to no greater than about 0.0490 nm/cm$^2$.

Item 97. The substrate of item 88, wherein the body comprises nitrogen.

Item 98. The substrate of item 88, wherein the body comprises gallium.

Item 99. The substrate of item 88, wherein the buffer layer comprises gallium nitride.

Item 100. The substrate of item 88, wherein the buffer layer consists essentially of gallium nitride.

Item 101. The substrate of item 88, wherein the plurality of optoelectronic devices comprises a Group III-V material.

Item 102. The substrate of item 88, wherein the plurality of optoelectronic devices comprises an alloy.

Item 103. The substrate of item 88, wherein the plurality of optoelectronic devices comprises $In_xGa_{1-x}N$, $0<X<1$.

Item 104. A production lot of substrate structures comprising at least about 10 substrate structures, wherein each substrate structure includes a substrate and a plurality of optoelectronic devices disposed on the substrate having a normalized lot light emission wavelength standard deviation of not greater than about 0.0641 nm/cm² at a wavelength of about 420 nm to about 500 nm.

Item 105. The production lot of item 105, wherein each of the substrate comprises a body including a Group III-V material and having an upper surface and an buffer layer overlying the upper surface of the body, wherein the production lot has an average lot buffer layer thickness within a range of between at least about 0.01 μm to no greater than about 1.3 μm.

Item 106. The production lot of item 105, wherein the average lot thickness of the buffer layers is within a range of between at least about 0.02 μm to no greater than about 1.2 μm, within a range of between at least about 0.05 μm to no greater than about 1.1 μm, within a range of between at least about 0.08 μm to no greater than about 1.0 μm, within a range of between at least about 0.1 to no greater than about 0.8 μm, or within a range of between at least about 0.2 to no greater than about 0.5 μm.

Item 107. The production lot of item 104, wherein the production lot has an average lot diameter of the substrates of at least about 2 inches (5.1 cm), at least about 3 inches (7.6 cm), at least about 4 inches (10 cm), at least about 5 inches (12.7 cm), or at least about 6 inches (15 cm).

Item 108. The production lot of item 104, wherein the production lot has an average lot diameter of the substrates of not greater than about 12 inches (approximately 30.5 cm), no greater than about 11 inches (approximately 27.9 cm), no greater than about 10 inches (approximately 25.4 cm), or no greater than about 9 inches (approximately 22.9 cm).

Item 109. The production lot of claim 104, wherein the production lot has an average lot diameter of the substrates within a range of between at least about 2 inches (approximately 5.1 cm) to no greater than about 12 inches (approximately 30.5 cm), within a range of between at least about 3 inches (approximately 7.6 cm) to no greater than about 11 inches (approximately 27.9 cm), within a range of between at least about 4 inches (approximately 10 cm) to no greater than about 10 inches (approximately 25.4 cm), or within a range of between at least about 5 inches (approximately 12.7 cm) to no greater than 9 inches (approximately 22.9 cm).

Item 110. The production lot of item 104, wherein the production lot has an average surface area of at least about 20.2 cm², at least about 45.4 cm², at least about 78.5 cm², at least about 126.7 cm², or at least about 176.6 cm².

Item 111. The production lot of item 104, wherein the production lot has an average lot surface area of the substrates of no greater than about 730.6 cm2, no greater than about 615.8 cm2, no greater than about 506.7 cm2, no greater than about 415.5 cm2.

Item 112. The production lot of item 104, wherein the production lot has an average surface area of the substrates within a range of between at least about 20.2 cm² to no greater than about 730.6 cm², within a range of between at least about 45.4 cm² to no greater than about 615.8 cm², within a range of at least about 78.5 cm² to no greater than 506.7 cm², or within a range of at least about 176.6 cm² to no greater than about 415.5 cm².

Item 113. The production lot of item 104, wherein the normalized light emission wavelength standard deviation (nσ) is lot light emission standard deviation normalized for an average lot surface area, the production lot having an average lot diameter of the substrates of at least 2 inches (5.1 cm).

Item 114. The production lot of item 113, wherein the lot light emission wavelength standard deviation is not greater than about 1.3 nm, not greater than about 1.2 nm, not greater than about 1 nm, not greater than about 0.9 nm, or not greater than about 0.8 nm.

Item 115. The production lot of item 113, wherein the lot light emission wavelength standard deviation is at least about 0.01 nm, at least about 0.05 nm, at least about 0.1 nm, at least about 0.2 nm, at least about 0.3 nm, or at least about 0.5 nm.

Item 116. The production lot of item 113, wherein the lot light emission wavelength standard deviation is within a range of between at least about 0.01 nm to no greater than about 1.3 nm, within a range of between at least about 0.05 nm to no greater than about 1.2 nm, within a range of between at least about 0.1 nm to no greater than about 1 nm, or within a range of between at least 0.2 nm to no greater than about 0.9 nm.

Item 117. The production lot of item 113, wherein nσ is no greater than about 0.0588 nm/cm², no greater than about 0.0539 nm/cm², no greater than about 0.0490 nm/cm², no greater than about 0.0441 nm/cm², or no greater than about 0.0392 nm/cm².

Item 118. The production lot of item 113, wherein nσ is at least about $1.4 \times 10^{-5}$ nm/cm², at least about $1.6 \times 10^{-5}$ nm/cm², at least about $2.0 \times 10^{-5}$ nm/cm², or at least about $2.4 \times 10^{-5}$ nm/cm².

Item 119. The production lot of claim 113, wherein nσ is within a range of between at least about $1.4 \times 10^{-5}$ nm/cm2 to no greater than about 0.0641 nm/cm2, within a range of between at least about $1.6 \times 10^{-5}$ nm/cm2 to no greater than about 0.0588 nm/cm2, within a range of between at least about $2.0 \times 10^{-5}$ nm/cm2 to no greater than about 0.0539 nm/cm2, or within a range of between at least about $2.4 \times 10^{-5}$ nm/cm2 to no greater than about 0.0490 nm/cm2.

Item 120. The production lot of item 105, wherein each body comprises nitrogen.

Item 121. The production lot of item 105, wherein each body comprises gallium.

Item 122. The production lot of item 105, wherein each body comprises gallium nitride.

Item 123. The production lot of item 105, wherein each buffer layer comprises gallium nitride.

Item 124. The production lot of item 105, wherein each buffer layer consists essentially of gallium nitride.

Item 125. A method of forming a substrate comprising: providing a body comprising a Group III-V material; and forming a buffer layer comprising a Group III-V material on the upper surface of the body, the buffer layer having an upper surface and a thickness within a range of between at least about 0.01 μm to no greater than about 1.3 μm.

Item 126. The method of item 125, wherein forming a buffer layer includes forming a buffer layer having a thickness of not greater than about 1.2 µm, not greater than about 1.1 µm, not greater than about 1.0 µm, not greater than about 0.9 µm, not greater than about 0.8 µm, not greater than about 0.7 µm, not greater than about 0.6 µm, or not greater than about 0.5 µm.

Item 127. The method of item 125, wherein forming a buffer layer includes forming a buffer layer having a thickness of at least about 0.02 µm, at least about 0.04 µm, at least about 0.08 µm, at least about 0.1 µm, or at least about 0.2 µm.

Item 128. The method of item 125, wherein forming a buffer layer includes forming a buffer layer having a thickness within a range of between at least about 0.02 µm to about not greater than 1.2 µm, within a range of between at least about 0.04 µm to not greater than about 1.1 µm, within a range of between at least about 0.08 µm to not greater than about 1.0 µm, within a range of between at least about 0.1 µm to not greater than about 0.8 µm, or within a range of between at least about 0.2 to not greater than about 0.5 µm.

Item 129. The method of item 125, further comprising forming a plurality of optoelectronic devices on the upper surface of the buffer layer, wherein the plurality of optoelectronic devices have a normalized light emission wavelength standard deviation (nσ) of no greater than about 0.0641 nm/cm² at a wavelength within a range of between about 420 nm to about 500 nm, wherein nσ is light emission wavelength standard deviation normalized for surface area of the substrate, the substrate having a diameter of at least about 2 inches (5.1 cm).

Item 130. The method of item 129, wherein the plurality of optoelectronic devices have a light emission wavelength standard deviation of not greater than about 1.3 nm, not greater than about 1.2 nm, not greater than about 1.1 nm, not greater than about 1.0 nm, or not greater than about 0.8 nm.

Item 131. The method of item 129, wherein the plurality of optoelectronic devices have a light emission wavelength standard deviation is at least 0.01 nm, at least 0.05 nm, at least 0.1 nm, at least 0.2 nm, at least 0.3 nm, or at least 0.5 nm.

Item 132. The method of item 129, wherein the light emission wavelength standard deviation is within a range of 0.01 nm to 1.3 nm, within a range of 0.05 nm to 1.2 nm, in a range of 0.1 to 1.4, or in a range of 0.2 to 0.9 nm.

Item 133. The method of item 129, wherein the body comprises nitrogen.

Item 134. The method of item 129, wherein the body comprises gallium.

Item 135. The method of item 129, wherein the buffer layer comprises gallium nitride.

Item 136. The method of item 129, wherein the buffer layer consists essentially of gallium nitride.

Item 137. The method of item 129, wherein the plurality of optoelectronic devices comprises a Group III-V material.

Item 138. The method of item 129, wherein the plurality of optoelectronic devices comprises an alloy.

Item 139. The method of item 129 wherein the plurality of optoelectronic devices comprises $In_xGa_{1-x}N$ $0<X<1$.

EXAMPLES

The following examples are provided to help illustrate the improvements described herein.

LED Samples 2-15 were fabricated on GaN substrates 2-15. Each of the substrate has a diameter of about 2 inches. The LED samples had the same structures and were fabricated and tested under identical conditions, with variations in the substrate thickness (300 and 400 nm), GaN buffer layer thickness, GaN substrate crystal curvature radius and offcut variation across the substrates.

The crystal curvature radius and offcut variation range were determined by X-Ray analysis. Sample 1, the sapphire substrate, is provided for comparison. The measurement of the various properties are conducted as described herein

TABLE 1

| Sample | Substrate Composition | Thickness of the Substrate (µm) | Crystal Curvature Radius of Substrate (m) | Offcut Variation Range- 2β (°) | Buffer Layer Thickness (µm) | LED wavelength (nm) | Wavelength Standard Deviation σ (nm) |
|---|---|---|---|---|---|---|---|
| 1 | Sapphire | 330 | | | 2.8 | 409 | 1.4 |
| 2 | GaN | 300 | −4.63 | 0.63 | 0 | 399 | 2.2 |
| 3 | GaN | 400 | 3.52 | 0.82 | 0 | 411 | 4.6 |
| 4 | GaN | 300 | 5.92 | 0.49 | 0.3 | 403 | 1.3 |
| 5 | GaN | 400 | 3.7 | 0.78 | 0.3 | 410 | 0.8 |
| 6 | GaN | 300 | −8.2 | 0.35 | 1.4 | 401 | 3.0 |
| 7 | GaN | 400 | 5.5 | 0.52 | 1.4 | 411 | 3.8 |
| 8 | GaN | 300 | 12.93 | 0.22 | 2.8 | 404 | 1.8 |
| 9 | GaN | 400 | 6.5 | 0.44 | 2.8 | 409 | 3.3 |
| 10 | GaN | 300 | 4.5 | 0.64 | 2.8 | 396 | 4.1 |
| 11 | GaN | 300 | 4.2 | 0.68 | 2.8 | 397 | 4.5 |
| 12 | GaN | 300 | 70 | 0.04 | 0.3 | 407 | 0.9 |
| 13 | GaN | 400 | 42 | 0.07 | 0.3 | 404 | 1.2 |
| 14 | GaN | 400 | −24 | −0.12 | 0.3 | 401 | 0.7 |
| 15 | GaN | 300 | 15 | 0.20 | 0.3 | 405 | 1.1 |

The embodiments herein represent a departure from the state-of-the-art. While certain bulk GaN substrates have been formed, such processes typically do not involve formation a buffer layer on the free-standing GaN substrate after finishing operations. Moreover, the offcut angle variation across the diameter of the substrates has not been effectively addressed. The present application discloses a particular process for forming semiconductive substrates using a particular combination of features, including forming a thin buffer layer having particular parameters. The forming process facilitates the production of free-standing Group III-V substrates having bodies with a particular combination of features, including, but not limited to, offcut angle, offcut angle variation, bow, crystalline bow, TTV, thickness, diameter, surface roughness, crystalline orientation, light emission wavelength standard deviation, and a combination thereof. Furthermore, forming a thin buffer layer on the free standing substrate may not necessarily change the parameters of the substrate including offcut angle, offcut angle variation, bow, and crystalline bow. Furthermore, optoelectronic devices formed on the free standing substrates disclosed herein can have better light wavelength standard deviation across the free standing substrate. Moreover, the processes of embodiments herein have proven useful in forming production lots of substrates having improved dimensional and crystalline properties, including. While not entirely understood, and not wishing to be tied to a particular theory, it has been noted that control of the buffer layer thickness may affect aspects of the overlying layers and/or devices, and remarkable and quite unexpectedly, facilitate formation of devices having improved performance. In the foregoing, reference to specific embodiments and the connections of certain components is illustrative. It will be appreciated that reference to components as being coupled or connected is intended to disclose either direct connection between said components or indirect connection through one or more intervening components as will be appreciated to carry out the methods as discussed herein. As such, the above-disclosed subject matter is to be considered illustrative, and not restrictive, and the appended claims are intended to cover all such modifications, enhancements, and other embodiments, which fall within the true scope of the present invention. Thus, to the maximum extent allowed by law, the scope of the present invention is to be determined by the broadest permissible interpretation of the following claims and their equivalents, and shall not be restricted or limited by the foregoing detailed description.

The Abstract of the Disclosure is provided to comply with Patent Law and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all features of any of the disclosed embodiments. Thus, the following claims are incorporated into the Detailed Description, with each claim standing on its own as defining separately claimed subject matter.

What is claimed is:

1. A substrate comprising:
   a body comprising a Group III-V material and having an upper surface; and
   a buffer layer comprising a Group III-V material adjacent the upper surface of the body, wherein the buffer layer has an average thickness within a range of between at least about 0.1 µm to not greater than about 0.8 µm,
   wherein the substrate is configured to provide a surface for formation of a plurality of optoelectronic devices overlying the buffer layer and having a normalized light emission wavelength standard deviation (nσ) of no greater than about 0.0641 nm/cm$^2$ at a wavelength within a range of between about 400 nm to about 550 nm.

2. The substrate of claim 1, wherein the substrate has a surface area within a range of between at least about 20.2 cm$^2$ to not greater than about 730.6 cm$^2$.

3. The substrate of claim 1, wherein the body comprises gallium nitride.

4. The substrate of claim 1, wherein the buffer layer comprises gallium nitride.

5. The substrate of claim 1, wherein the buffer layer consists essentially of gallium nitride.

6. The substrate of claim 1, wherein the substrate has a diameter of at least about 2 inches (5.1 cm).

7. A substrate structure comprising:
   a substrate comprising a Group III-V material having an upper surface;
   a buffer layer comprising a Group III-V material adjacent the upper surface of the substrate, wherein the buffer layer has an average thickness within a range of between at least about 0.1 µm to not greater than about 0.8 µm; and
   a plurality of optoelectronic devices disposed on the buffer layer, wherein the plurality of optoelectronic devices have a normalized light emission wavelength standard deviation (nσ) of not greater than about 0.0641 nm/cm$^2$ at a wavelength within a range of between about 400 nm to about 550 nm.

8. The substrate structure of claim 7, wherein nσ is light emission wavelength standard deviation normalized for surface area of the substrate, the substrate having a diameter of at least about 2 inches (5.1 cm).

9. The substrate of claim 7, wherein the substrate has a surface area within a range of between at least about 20.2 cm$^2$ to not greater than about 730.6 cm$^2$.

10. The substrate of claim 7, wherein the light emission wavelength standard deviation (σ) is not greater than about 1.3 nm.

11. The substrate of claim 7, wherein the buffer layer has an average thickness within a range of between at least about 0.2 µm to not greater than about 0.7 µm.

12. The substrate of claim 7, wherein the substrate comprises an offcut angle (α) defined between the upper surface and a crystallographic reference plane, and an offcut angle variation (2β) of not greater than about 1 degrees.

13. The substrate of claim 7, wherein the plurality of optoelectronic devices comprises a Group III-V material.

14. The substrate of claim 7, wherein the plurality of optoelectronic devices comprises $In_xGa_{1-x}N$, $0<X<1$.

15. A production lot of substrate structures comprising at least about 20 substrate structures, wherein each substrate structure includes:
   a substrate having an upper surface;
   a buffer layer comprising a Group III-V material adjacent the upper surface of the substrate, wherein the buffer layer has an average thickness within a range of between at least about 0.1 µm to not greater than about 0.8 µm; and
   a plurality of optoelectronic devices disposed on the buffer layer and having a normalized lot light emission wavelength standard deviation of not greater than about 0.0641 nm/cm$^2$ at a wavelength of about 400 nm to about 550 nm.

16. The production lot of claim 15, wherein the normalized light emission wavelength standard deviation (nσ) is lot light emission standard deviation normalized for an average lot substrate surface area, the production lot having an average lot diameter of the substrates of at least 2 inches (5.1 cm).

17. The production lot of claim 15, wherein the production lot has an average lot buffer layer thickness within a range of between at least about 0.2 µm to no greater than about 0.7 µm.

18. The production lot of claim 15, wherein the production lot has an average substrate surface area within a range of between at least about 20.2 cm$^2$ to no greater than about 730.6 cm$^2$.

19. The production lot of claim 15, wherein each substrate comprises gallium nitride.

20. The substrate of claim 1, wherein the light emission wavelength standard deviation is not greater than about 0.0588 nm/cm$^2$ at the wavelength of about 400 nm to about 550 nm.

* * * * *